US012805134B2

(12) United States Patent
Lee et al.

(10) Patent No.: US 12,805,134 B2
(45) Date of Patent: Nov. 17, 2026

(54) DISPLAY DEVICE

(71) Applicant: SAMSUNG DISPLAY CO., LTD., Yongin-si (KR)

(72) Inventors: Seung Min Lee, Yongin-si (KR); Dong Jo Kim, Yongin-si (KR); Hyun Kim, Yongin-si (KR); Dan Bi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 309 days.

(21) Appl. No.: 18/756,339

(22) Filed: Jun. 27, 2024

(65) Prior Publication Data

US 2025/0098456 A1 Mar. 20, 2025

(30) Foreign Application Priority Data

Sep. 19, 2023 (KR) ........................ 10-2023-0124492

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(58) Field of Classification Search
CPC .... H10K 59/124; H10K 59/131; H10K 77/10; H10K 77/11; H10K 2102/311
See application file for complete search history.

(56) References Cited

U.S. PATENT DOCUMENTS

| | | | | |
|---|---|---|---|---|
| 2017/0170206 | A1* | 6/2017 | Lee | H10D 30/6723 |
| 2019/0189640 | A1* | 6/2019 | Huang | G02F 1/13452 |
| 2020/0067016 | A1* | 2/2020 | Park | H10K 59/122 |
| 2022/0102468 | A1 | 3/2022 | Lee et al. | |
| 2023/0095650 | A1* | 3/2023 | He | H10K 71/00 257/40 |

FOREIGN PATENT DOCUMENTS

| | | | |
|---|---|---|---|
| KR | 2020-0002576 | A | 1/2020 |
| KR | 2020-0080752 | A | 7/2020 |
| KR | 2020-0144626 | A | 12/2020 |
| KR | 2021-0086288 | A | 7/2021 |

* cited by examiner

*Primary Examiner* — David C Spalla
(74) *Attorney, Agent, or Firm* — Womble Bond Dickinson (US) LLP

(57) ABSTRACT

A display device includes a substrate including a main region and a pad area; a buffer layer on the main region of the substrate; a first electrode on the buffer layer; a first wiring protection layer on the substrate, the first wiring protection layer overlapping a bending area located between the main region and the pad area; a signal line on the first electrode and the first wiring protection layer; a display element layer on the signal line, the display element layer overlapping the main region; and a bending protection layer on the signal line, the bending protection layer overlapping the bending area, and the substrate includes a first substrate overlapping the main region, and a second substrate spaced apart from the first substrate with the bending area therebetween, and overlapping the pad area.

20 Claims, 14 Drawing Sheets

MA: DA, NDA
100 : 110, 130, 150, 170, 180
110 : 110a, 110b

110: 110a, 110b
120: 120a, 120b
130: 113, 115, 117, 119, 125
150: 151
410: 410a, 410b, 410c

MA: DA, NDA
110: 110a, 110b
110a: 110a1, 110a2, 110a3
110a3: s1, s2
110b: 110b1, 110b2, 110b3
110b3: s3, s4

DISPLAY DEVICE

CROSS-REFERENCE TO RELATED APPLICATION

The present application claims priority to and the benefit of Korean Patent Application No. 10-2023-0124492, filed on Sep. 19, 2023 in the Korean Intellectual Property Office, the entire disclosure of which is incorporated herein by reference.

BACKGROUND

1. Field

Aspects of embodiments of the present disclosure relate to a display device.

2. Description of the Related Art

With the advance of information-oriented society, more and more demands are placed on display devices for displaying images in various ways. The display device may be a flat panel display device, such as a liquid crystal display, a field emission display and a light emitting display.

The display device includes a display area for displaying an image and a non-display area disposed around the display area, for example, to surround the display area. Recently, a width of the non-display area has been gradually reduced to increase immersion in the display area and enhance the aesthetics of the display device.

Meanwhile, in order to reduce the width of the non-display area, a bending area may be formed between a pad area and the display area, and the bending area may be bent to place the pad area below the display panel. In this case, a substrate overlapping the bending area may be removed by an etching process during the manufacturing process.

SUMMARY

According to an aspect of embodiments of the present disclosure, a display device that may overcome or avoid corrosion defects of wiring overlapping a bending area is provided.

However, aspects of the present disclosure are not restricted to those set forth herein. The above and other aspects of the present disclosure will become more apparent to one of ordinary skill in the art to which the present disclosure pertains by referencing the detailed description of the present disclosure provided below.

According to one or more embodiments of the disclosure, a display device includes a substrate including a main region and a pad area; a buffer layer on the main region of the substrate; a first electrode on the buffer layer; a first wiring protection layer on the substrate, the first wiring protection layer overlapping a bending area located between the main region and the pad area; a signal line on the first electrode and the first wiring protection layer; a display element layer on the signal line, the display element layer overlapping the main region; and a bending protection layer on the signal line, the bending protection layer overlapping the bending area, wherein the substrate comprises a first substrate overlapping the main region, and a second substrate spaced apart from the first substrate with the bending area therebetween, and overlapping the pad area, the first wiring protection layer is in contact with the first substrate and the second substrate, and the first wiring protection layer is spaced apart from the buffer layer in a direction parallel to the substrate with a first gap therebetween.

The first substrate may include a top surface facing the buffer layer; a bottom surface opposite to the top surface; a first inclined surface connected to the top surface and facing the bending area; and a second inclined surface connecting the bottom surface to the first inclined surface, and facing the bending area.

An inclination angle formed by the top surface and the first inclined surface and an inclination angle formed by the bottom surface and the second inclined surface may be obtuse angles.

The first wiring protection layer may overlap the first inclined surface and the second inclined surface.

An undercut may be formed between the first wiring protection layer and the first inclined surface.

The substrate may not overlap the bending area, and a thickness of the substrate may be 200 μm or less.

The first wiring protection layer may include a first surface facing the substrate, and the first surface may include a first portion in contact with the first substrate, a second portion in contact with the second substrate, and a third portion located between the first portion and the second portion and overlapping the bending area.

The third portion may be exposed to an outside.

The first gap may be 2 μm or greater.

The first wiring protection layer may include an inorganic layer containing silicon.

The signal line may contain titanium and aluminum.

The display device may further include a via layer located between the first wiring protection layer and the signal line, wherein the via layer completely covers the first wiring protection layer.

A width of the bending protection layer in a direction parallel to the substrate may be greater than a width of the first wiring protection layer.

The display device may further include a second wiring protection layer between the substrate and the first wiring protection layer, wherein the first wiring protection layer completely covers the second wiring protection layer.

The second wiring protection layer may include a second surface facing the substrate, the second surface may include a fourth portion in contact with the first substrate, a fifth portion in contact with the second substrate, and a sixth portion located between the fourth portion and the fifth portion and overlapping the bending area, and the sixth portion may be exposed to an outside.

The second wiring protection layer may include polyimide.

A gap between a side surface of the first wiring protection layer and a side surface of the second wiring protection layer may be 2 μm or greater.

According to one or more embodiments of the disclosure, a display device includes a substrate including a main region and a pad area; a buffer layer on the main region of the substrate; a first electrode on the buffer layer; a first wiring protection layer on the substrate, the first wiring protection layer overlapping a bending area located between the main region and the pad area; a signal line on the first electrode and the first wiring protection layer; and a bending protection layer on the signal line, the bending protection layer overlapping the bending area, wherein the first wiring protection layer is covered by the bending protection layer while overlapping the main region and the pad area in a plan view.

The display device may further include a second wiring protection layer located between the substrate and the first wiring protection layer, wherein the second wiring protection layer is covered by the first wiring protection layer while overlapping the main region and the pad area in the plan view.

The first wiring protection layer, the second wiring protection layer, and the bending protection layer may completely cover the signal line while overlapping the bending area in the plan view.

In the display device according to embodiments of the present disclosure, at least one of an inorganic layer or an organic layer may be included between a substrate and the wiring overlapping the bending area to overcome or avoid wiring corrosion defects that may occur in the bending area.

However, aspects and effects of embodiments of the present disclosure are not limited to those described above, and various other aspects and effects are incorporated herein.

BRIEF DESCRIPTION OF THE DRAWINGS

The above and other aspects and features of the present disclosure will become more apparent by describing in further detail some embodiments thereof with reference to the attached drawings, in which.

DETAILED DESCRIPTION

The present invention will now be described more fully herein with reference to the accompanying drawings, in which some embodiments of the invention are shown. The invention may, however, be embodied in different forms and is not to be construed as limited to the embodiments set forth herein. Rather, these embodiments are provided so that this disclosure will be thorough and complete, and will fully convey the scope of the invention to those skilled in the art.

It is also to be understood that when a layer is referred to as being "on" another layer or substrate, it may be directly on the other layer or substrate, or one or more intervening layers may also be present. The same reference numbers indicate the same components throughout the specification.

It is to be understood that, although the terms "first," "second," etc. may be used herein to describe various elements, these elements are not to be limited by these terms. These terms are used to distinguish one element from another element. For instance, a first element discussed below could be termed a second element without departing from the teachings of the invention. Similarly, the second element could also be termed a first element.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Herein, some embodiments of the present disclosure will be described in further detail with reference to the accompanying drawings.

Figure 1:
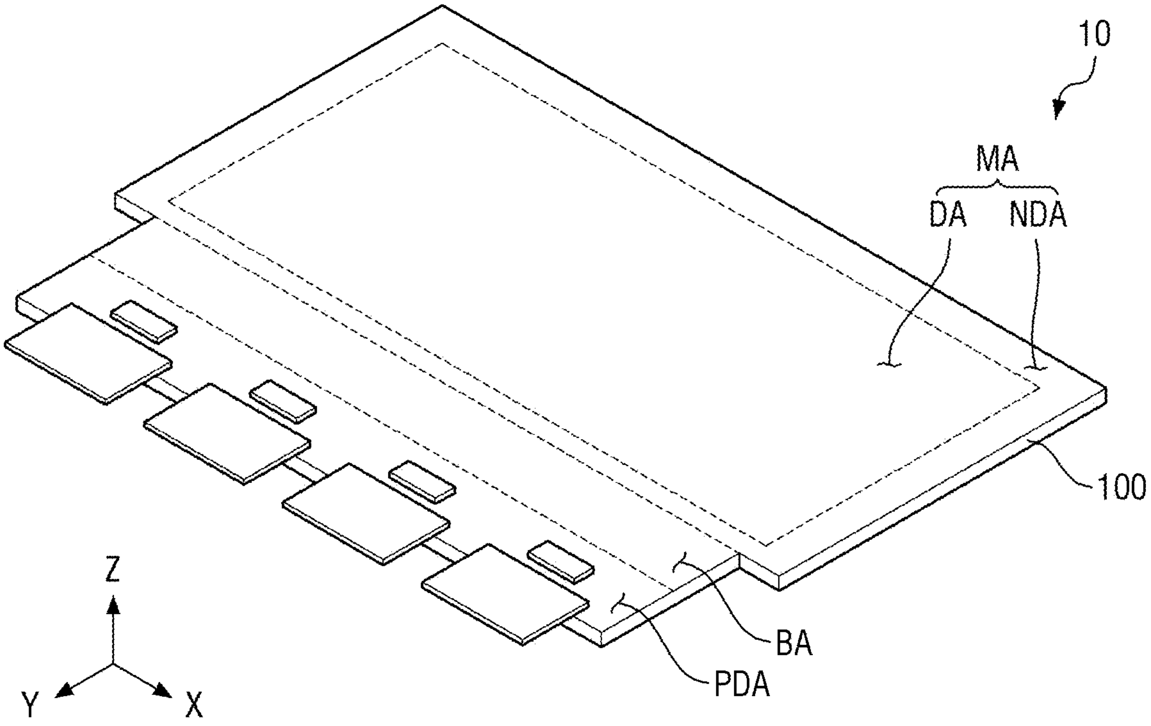
FIG. 1 is a perspective view illustrating a display device according to an embodiment.
Figure 2:
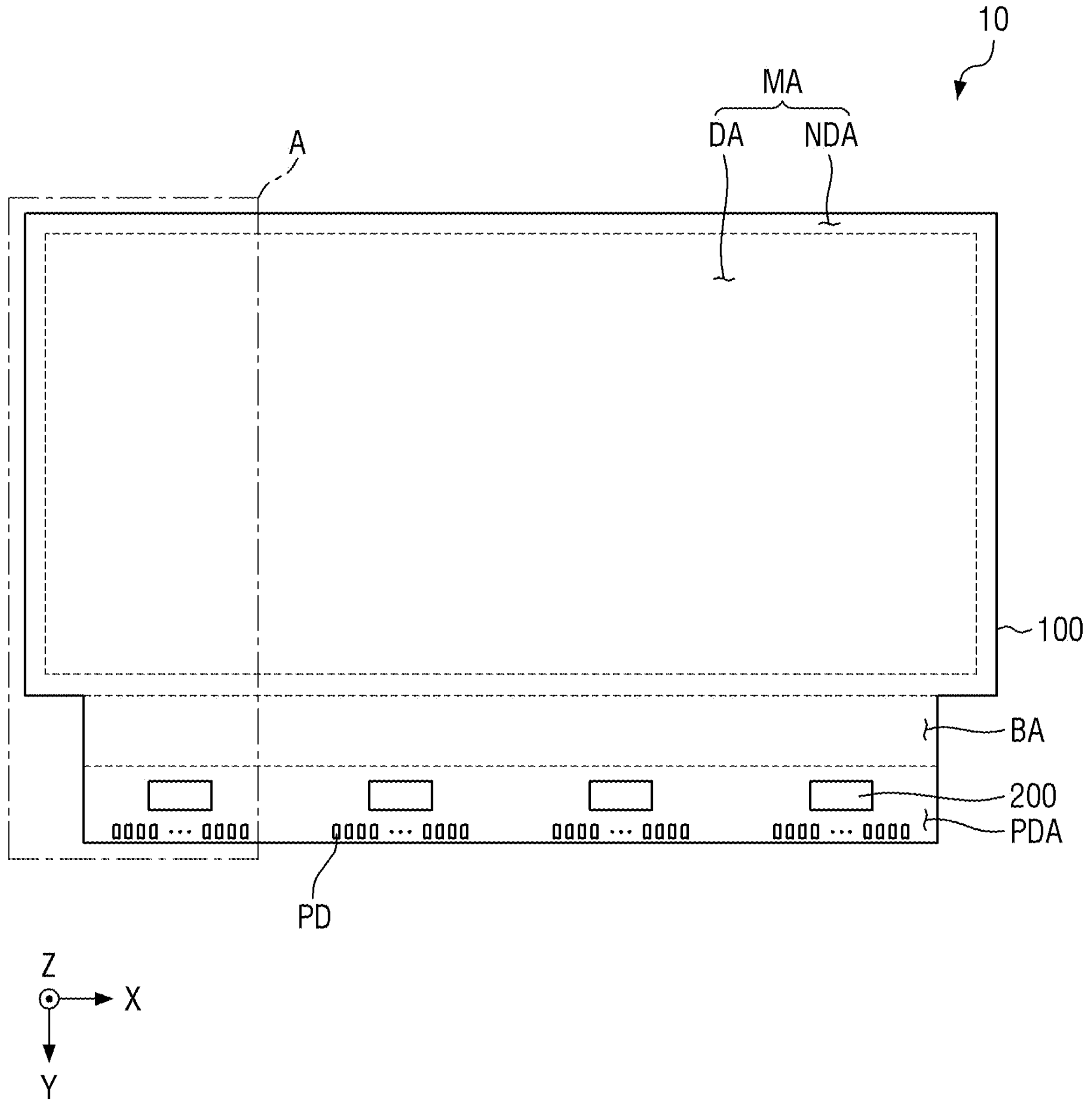
FIG. 2 is a plan view of the display device of FIG. 1 with a circuit board removed.

FIG. 1 is a perspective view illustrating a display device according to an embodiment. FIG. 2 is a plan view of the display device of FIG. 1 with a circuit board removed.

Referring to FIGS. 1 and 2, a display device 10 is a device for displaying a moving image or a still image. The display device 10 may be used as a display screen of any of various devices, such as a television, a laptop computer, a monitor, a billboard, and an Internet-of-Things (IOT) device, as well as portable electronic devices, such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 10 according to an embodiment may be a light emitting display device, such as any of an organic light emitting display using an organic light emitting diode, a quantum dot light emitting display including a quantum dot light emitting layer, an inorganic light emitting display including an inorganic semiconductor, and a micro or nano light emitting display using a micro or nano light emitting diode (LED). In the following description, it is described that the display device 10 is an organic light emitting display device, but the present disclosure is not limited thereto.

The display device 10 according to an embodiment may include a display panel 100, a display driver 200, and a circuit board 300.

In an embodiment, the display panel 100 may be formed in a quadrilateral shape, in a plan view, having one side in a first direction (X-axis direction) and one side in a second direction (Y-axis direction) crossing the first direction (X-axis direction). A corner where one side in the first direction (X-axis direction) and one side in the second direction (Y-axis direction) meet may be a right angle or rounded with a curvature. However, the planar shape of the display panel 100 is not limited to the rectangular shape, and may be formed in another polygonal shape, a circular shape, or an elliptical shape, for example.

In the illustrated figures, the first direction (X-axis direction) and the second direction (Y-axis direction) cross each other as horizontal directions. For example, the first direction (X-axis direction) and the second direction (Y-axis direction) may be orthogonal to each other. In addition, a third direction (Z-axis direction) crosses the first direction (X-axis direction) and the second direction (Y-axis direction), and the directions may be, for example, perpendicular directions orthogonal to each other. In the present specification, directions indicated by arrows of the first to third directions X, Y, and Z (X-axis direction, Y-axis direction, and Z-axis direction) may be referred to as one side, and the opposite directions thereto may be referred to as the other side.

The display panel 100 may be formed to be flat, but is not limited thereto. For example, the display panel 100 may include a curved portion formed at left and right ends and having a constant curvature or a varying curvature. In addition, the display panel 100 may be formed to be flexible such that it can be curved, bent, folded, or rolled.

The display panel 100 may include a main region MA, a bending area BA, and a pad area PDA. The main region MA may include a display area DA displaying an image and a non-display area NDA disposed around the display area DA.

The display area DA may occupy most of the area of the display panel 100. In an embodiment, the display area DA may be disposed at a center of the display panel 100. Pixels each including a plurality of emission areas may be disposed in the display area DA to display an image. In an embodiment, the display area DA may be formed in a rectangular shape, in a plan view, having long sides in a first direction (X-axis direction) and short sides in a second direction (Y-axis direction) crossing the first direction (X-axis direction).

The non-display area NDA may be disposed adjacent to the display area DA. The non-display area NDA may be an area outside the display area DA. In an embodiment, the non-display area NDA may be disposed to surround the display area DA. The non-display area NDA may be an edge area of the display panel 100.

The bending area BA may be disposed between the main region MA and the pad area PDA in the second direction (Y-axis direction). The bending area BA may be an area that bends toward a bottom of the display panel 100. When the bending area BA is bent toward the bottom of the display panel 100, a plurality of display drivers 200 and circuit boards 300 may be disposed below the display panel 100 in the third direction (Z-axis direction). In the drawings, a width of the bending area BA in the first direction (X-axis direction) is shown to be smaller than a width of the main region MA, but the present disclosure is not limited thereto. For example, the width of the bending area BA may be the same as that of the main region MA.

The pad area PDA may be a lower edge area of the display panel 100. The pad area PDA may be an area where the display drivers 200 and display pads PD connected to the circuit boards 300 are disposed. As shown in FIG. 2, the display pads PD may be disposed at an edge of the display panel 100.

The display drivers 200 may generate data voltages, source voltages, scan timing signals, and the like. The display drivers 200 may output the data voltages, the source voltages, the scan timing signals, and the like. In an embodiment, each of the display drivers 200 may be attached to the non-display area NDA of the display panel 100 in a chip on glass (COG) method. In another embodiment, each of the display drivers 200 may be attached to the circuit board 300 in a chip on plastic (COP) method.

The circuit boards 300 may be disposed on the display pads PD. The circuit boards 300 may be attached to the display pads PD by using a conductive adhesive member, such as an anisotropic conductive film and an anisotropic conductive adhesive. Accordingly, the circuit boards 300 may be electrically connected to the signal lines of the display panel 100. The circuit boards 300 may be a flexible printed circuit board or a flexible film, such as a chip on film.

Figure 3:
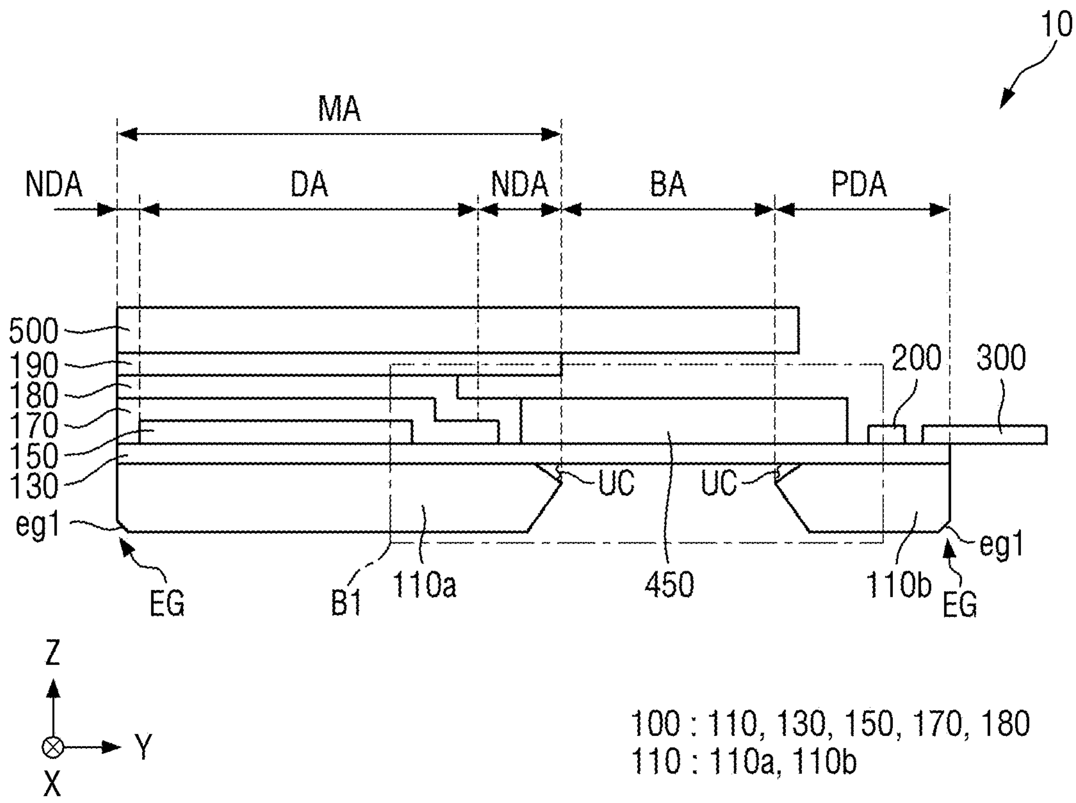
FIG. 3 is a cross-sectional view showing a schematic side surface of the display device of FIG. 1.

FIG. 3 is a cross-sectional view showing a schematic side surface of the display device 10 of FIG. 1.

Referring to FIG. 3, the display device 10 may include the display panel 100, a polarizing film 190, and a cover window 500. The display panel 100 may include a substrate 110, a thin film transistor layer 130, a display element layer 150, a thin film encapsulation layer 170, a touch sensor layer 180, and a bending protection layer 450.

The substrate 110 may be made of a light-transmitting and hard material. For example, the substrate 110 may be a glass substrate or a plastic substrate. In an embodiment, the substrate 110 may be formed of ultra-thin glass (UTG) having a thickness of 200 μm or less.

In an embodiment, in the substrate 110 disclosed herein, a portion overlapping the bending area BA may be etched during a manufacturing process to provide the bending area BA. As a result, the substrate 110 may be divided into a first substrate 110*a* and a second substrate 110*b*. The first substrate 110*a* and the second substrate 110*b* may be located to be spaced apart from each other while exposing the bending area BA. The first substrate 110*a* may be disposed to overlap the main region MA, and the second substrate 110*b* may be disposed to overlap the pad area PDA. In an embodiment, the substrate 110 may not overlap the bending area BA, but is not limited thereto. Depending on a manufacturing process, a part of the substrate 110 may overlap the bending area BA.

In some embodiments, the first substrate 110*a* and the second substrate 110*b* of the substrate 110 may include an inclined surface facing the bending area BA, and an undercut UC may be formed between the thin film transistor layer 130 and the inclined surface. As described above, this may be formed by etching a part of the bending area BA through an etching process. A further detailed description thereof will be provided later. The undercut UC formed in the substrate 110 may not overlap the display element layer 150, the thin film encapsulation layer 170, and the touch sensor layer 180, which will be described later.

In some embodiments, the substrate 110 may include edges EG at both, or opposite, ends in the second direction (Y-axis direction). In addition, the substrate 110 may include an edge surface eg1 on a surface overlapping the edge EG. The edge surface eg1 may be located on a surface opposite to the thin film transistor layer 130. The second substrate 110*b* may include the edge surface eg1 overlapping the edge EG on a side in the second direction (Y-axis direction), and the first substrate 110*a* may include the edge surface eg1 overlapping the edge EG on another side in the second direction (Y-axis direction). The edge surface eg1 may be an inclined surface. This may be caused by the display device 10 including a process of cutting each cell using a laser process and an etching process in a manufacturing process.

The thin film transistor layer 130 may be disposed on the substrate 110. The thin film transistor layer 130 may include a plurality of thin film transistors TFT (see FIG. 7). The thin film transistor layer 130 may be disposed in the main region MA, the bending area BA, and the pad area PDA.

The display element layer 150 may be located on the thin film transistor layer 130, and may overlap the display area DA of the main region MA. The display element layer 150 may display an image, and may include a light emitting element ED (see FIG. 7) that emits light and a pixel defining layer 151 (see FIG. 7) that defines the emission area.

The thin film encapsulation layer 170 may be disposed on the display element layer 150. The thin film encapsulation layer 170 may prevent or substantially prevent oxygen or moisture from permeating into the display element layer 150. The thin film encapsulation layer 170 may include at least one inorganic layer and one organic layer. An organic layer of the thin film encapsulation layer 170 may protect the display element layer 150 from foreign substances, such as dust.

The touch sensor layer 180 may be disposed on the thin film encapsulation layer 170. The touch sensor layer 180 may detect a user's touch using touch wires.

The polarizing film 190 may be disposed on the display panel 100 to reduce reflection of external light. The polarizing film 190 may be disposed to overlap the display area DA of the main region MA.

The cover window 500 may be disposed on the polarizing film 190. The cover window 500 may be attached on the polarizing film 190 by a transparent adhesive member, such as an optically clear adhesive (OCA) film.

The bending protection layer 450 may be located on the thin film transistor layer 130 while overlapping the bending area BA. The bending protection layer 450 may protect, when the display panel 100 is bent, a lower structure overlapping the bending area BA.

In an embodiment, the bending protection layer 450 may include a synthetic resin. As an example, the bending protection layer 450 may contain at least one of acrylonitrile butadiene styrene copolymer (ABS), urethane acrylate (UA), polyurethane (PU), polyethylene (PE), ethylene vinyl acetate (EVA), or polyvinyl chloride (PVC).

The display driver 200 and the circuit board 300 may be located above the substrate 110 while overlapping the pad area PDA. In the drawings, the display driver 200 and the circuit board 300 are shown as being located on the thin film transistor layer 130, but the present disclosure is not limited thereto. In an embodiment, the display driver 200 and the circuit board 300 may be positioned in contact with the substrate 110. The display driver 200 may be located between the bending protection layer 450 and the circuit board 300 in the second direction (Y-axis direction), and may be spaced apart from the bending protection layer 450 and the circuit board 300 in the second direction (Y-axis direction).

Figure 4:
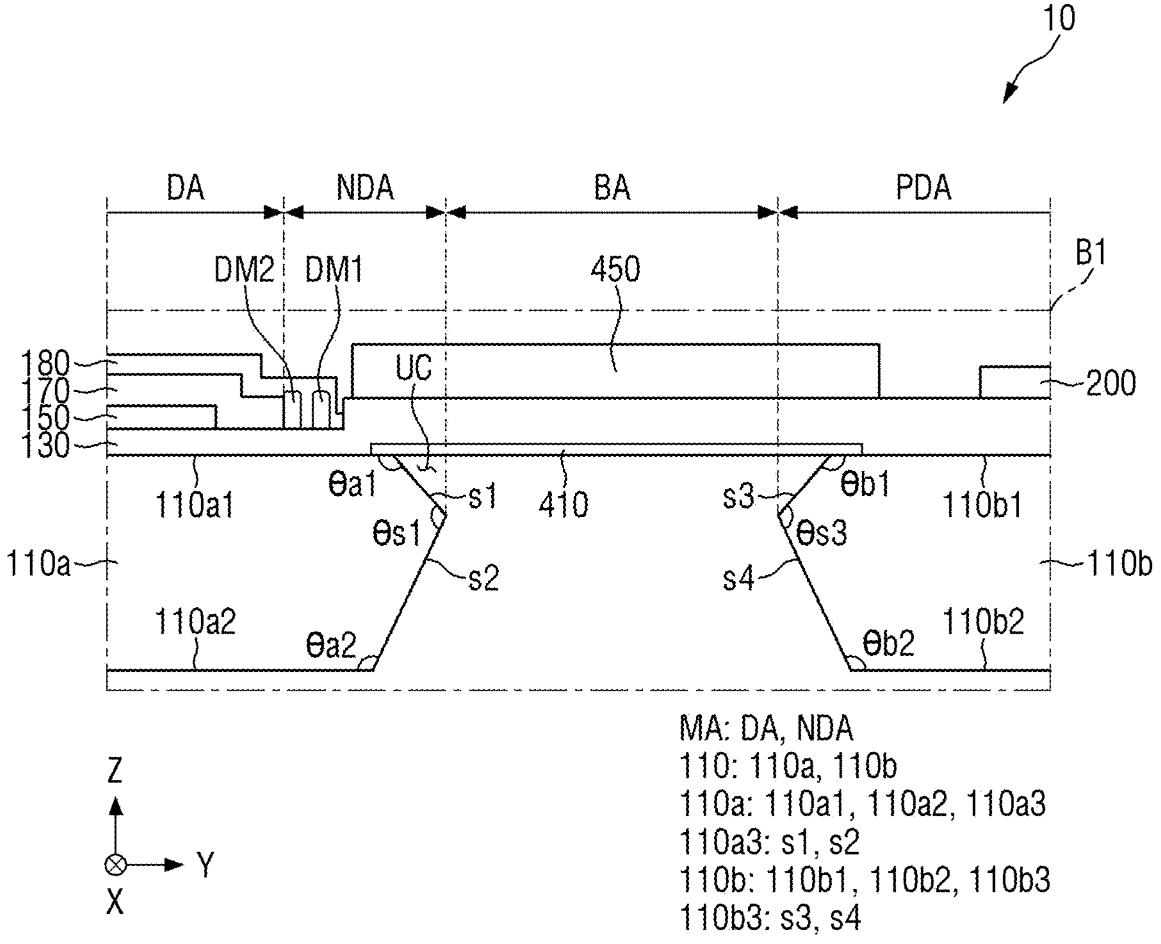
FIG. 4 is an enlarged cross-sectional view of a region "B1" of FIG. 3.

FIG. 4 is an enlarged cross-sectional view of a region "B1" of FIG. 3.

Referring to FIG. 4, the first substrate **110*a* may include a top surface 110*a*1, a bottom surface 110*a*2, and a side surface 110*a*3. The side surface 110*a*3 of the first substrate 110*a* may be positioned toward the bending area BA, and the top surface 110*a*1 and the bottom surface 110*a*2 thereof may be connected to each other by the side surface 110*a*3 thereof in the display device 10. The side surface 110*a*3 of the first substrate 110*a* may include a first inclined surface s1 connected to the top surface 110*a*1 and a second inclined surface s2 connected to the bottom surface 110*a*2**.

In some embodiments, a first inclination angle θa1 formed by the top surface **110*a*1 and the first inclined surface s1 of the first substrate 110*a*, and a second inclination angle θa2 formed by the bottom surface 110*a*2 and the second inclined surface s2 of the first substrate 110*a* may be obtuse angles. In addition, the first inclined surface s1 and the second inclined surface s2 may extend from each other, and the first inclined surface s1 and the second inclined surface s2 may form a third inclination angle θs1. The third inclination angle θs1** may be an acute angle or an obtuse angle depending on a manufacturing process.

In some embodiments, the second substrate **110*b* of the display device 10 may include a top surface 110*b*1, a bottom surface 110*b*2, and a side surface 110*b*3 facing the bending area BA. The top surface 110*b*1 of the second substrate 110*b* may be a surface in contact with the thin film transistor layer 130, and the bottom surface 110*b*2 of the second substrate 110*b* may be a surface opposite to the top surface 110*b*1. The side surface 110*b*3 of the second substrate 110*b* may be a surface that is positioned toward the bending area BA and connects the top surface 110*b*1 of the second substrate 110*b* to the bottom surface 110*b*2** thereof.

The side surface **110*b*3 of the second substrate 110*b* may include a first inclined surface s3 connected to the top surface 110*b*1, and a second inclined surface s4 connected to the bottom surface 110*b*2. A first inclination angle θb1 formed by the top surface 110*b*1 and the first inclined surface s3 of the second substrate 110*b*, and a second inclination angle θb2 formed by the bottom surface 110*b*2 and the second inclined surface s4 of the second substrate 110*b* may be obtuse angles. In addition, the first inclined surface s3 and the second inclined surface s4 may extend from each other, and the first inclined surface s3 and the second inclined surface s4 may form a third inclination angle θs3. The third inclination angle θs3** may be an acute angle or an obtuse angle depending on a manufacturing process.

A first wiring protection layer 410 may be located on the substrate 110 while overlapping the non-display area NDA, the bending area BA, and the pad area PDA. A first side of the first wiring protection layer 410 may be in contact with the second substrate **110*b*, and a second side of the first wiring protection layer 410 may be in contact with the first substrate 110*a***.

In some embodiments, the first wiring protection layer 410 of the display device 10 may be formed to be entirely in contact with the substrate 110, and then the substrate 110 overlapping the bending area BA may be etched in a subsequent process, such that a part of the first wiring protection layer 410 overlapping the bending area BA may not overlap the substrate 110. Accordingly, the first wiring protection layer 410 overlapping the bending area BA may be exposed to the outside of the display device 10 without being in contact with the substrate 110.

In some embodiments, the first wiring protection layer 410 may be located to overlap the first inclined surface s1 and the second inclined surface s2 included in the first substrate **110*a*, and the undercut UC may be formed between the first wiring protection layer 410 and the first inclined surface s1. In addition, the first wiring protection layer 410 may be located to overlap the first inclined surface s3 and the second inclined surface s4 included in the second substrate 110*b*, and the undercut UC may be formed between the first wiring protection layer 410 and the first inclined surface s3**.

The first wiring protection layer 410 may protect signal lines 120 overlapping the bending area BA. As described above, in the display device 10, a part of the substrate 110 overlapping the bending area BA may be etched to obtain the bending area BA that does not include the substrate 110. Accordingly, the display device 10 included in the present embodiment may include the first wiring protection layer 410 on the substrate 110 to overlap the bending area BA, thereby protecting the signal lines 120 overlapping the bending area BA from corrosion by the etching solution used during the manufacturing process.

The first wiring protection layer 410 may be an inorganic layer with good acid resistance properties. In an example, the first wiring protection layer 410 may include silicon nitride. However, the present disclosure is not limited thereto, and any suitable inorganic layer having acid resistance properties to hydrogen fluoride (HF) may be included.

The thin film transistor layer 130 may be located on the substrate 110 and the first wiring protection layer 410. A further detailed structure of the thin film transistor layer 130 will be provided later.

In an embodiment, a first dam DM1 and a second dam DM2 may be located on the thin film transistor layer 130 while overlapping the non-display area NDA. The first dam DM1 and the second dam DM2 may be a boundary between the display area DA and the non-display area NDA. In the drawings, the display area DA and the non-display area NDA are shown to be distinguished by the second dam DM2, but the present disclosure is not limited thereto.

The display device 10 may have a structure in which a plurality of layers are sequentially stacked on the substrate 110. Some of the layers of the display device 10 may be made of an organic material, and may be formed by a process of directly applying the organic material onto the substrate 110. By way of example, in the thin film encapsulation layer 170, an encapsulation layer containing an organic material may be flowable. Accordingly, the organic material applied onto the display area DA may overflow into the bending area BA and the pad area PDA. Therefore, the first dam DM1 and the second dam DM2 may prevent or substantially prevent organic materials disposed in the display area DA from overflowing into the bending area BA and the pad area PDA.

The bending protection layer 450 may be located on the thin film transistor layer 130 while overlapping the non-display area NDA, the bending area BA, and the pad area PDA. The bending protection layer 450 may be located to overlap the bending area BA, and may extend to the non-display area NDA and the pad area PDA. A first side of the bending protection layer 450 may be located above the second substrate 110*b*, and a second side of the bending protection layer 450 may be located above the first substrate 110*a*. The bending protection layer 450 may be located to overlap the first inclined surface s1 and the second inclined surface s2 included in the first substrate 110*a*, and, further, the bending protection layer 450 may be located to overlap the first inclined surface s3 and the second inclined surface s4 included in the second substrate 110*b*. The bending protection layer 450 may overlap the first wiring protection layer 410. A relationship between the bending protection layer 450 and the first wiring protection layer 410 will be described later.

Figure 5:
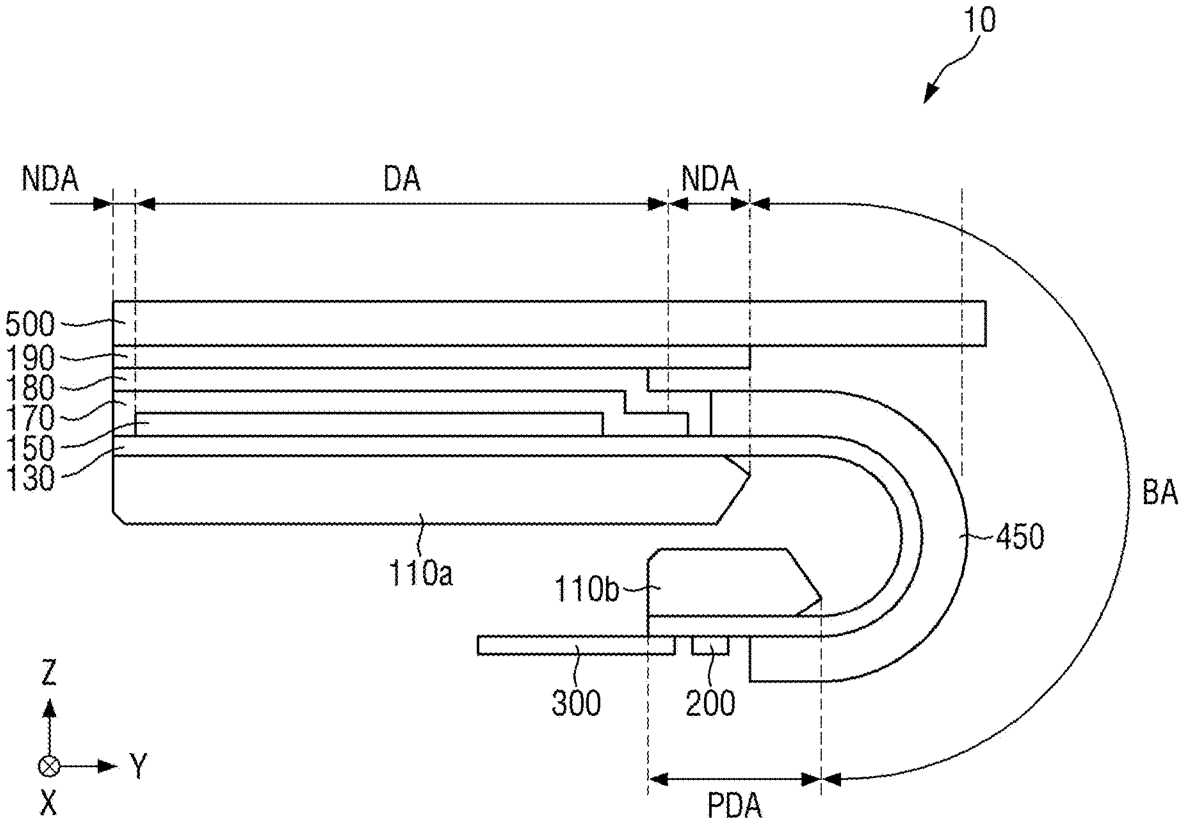
FIG. 5 is a cross-sectional view showing the display device of FIG. 3 in a bent state.

FIG. 5 is a cross-sectional view showing the display device 10 of FIG. 3 in a bent state.

Referring to FIG. 5, a part of the display device 10 may be bent by the bending area BA. When the display device 10 is bent, the pad area PDA of the display device 10 may overlap the main region MA in the third direction (Z-axis direction). In addition, when the display device 10 is bent, the first substrate 110*a* and the second substrate 110*b* may overlap each other in the third direction (Z-axis direction).

Figure 6:
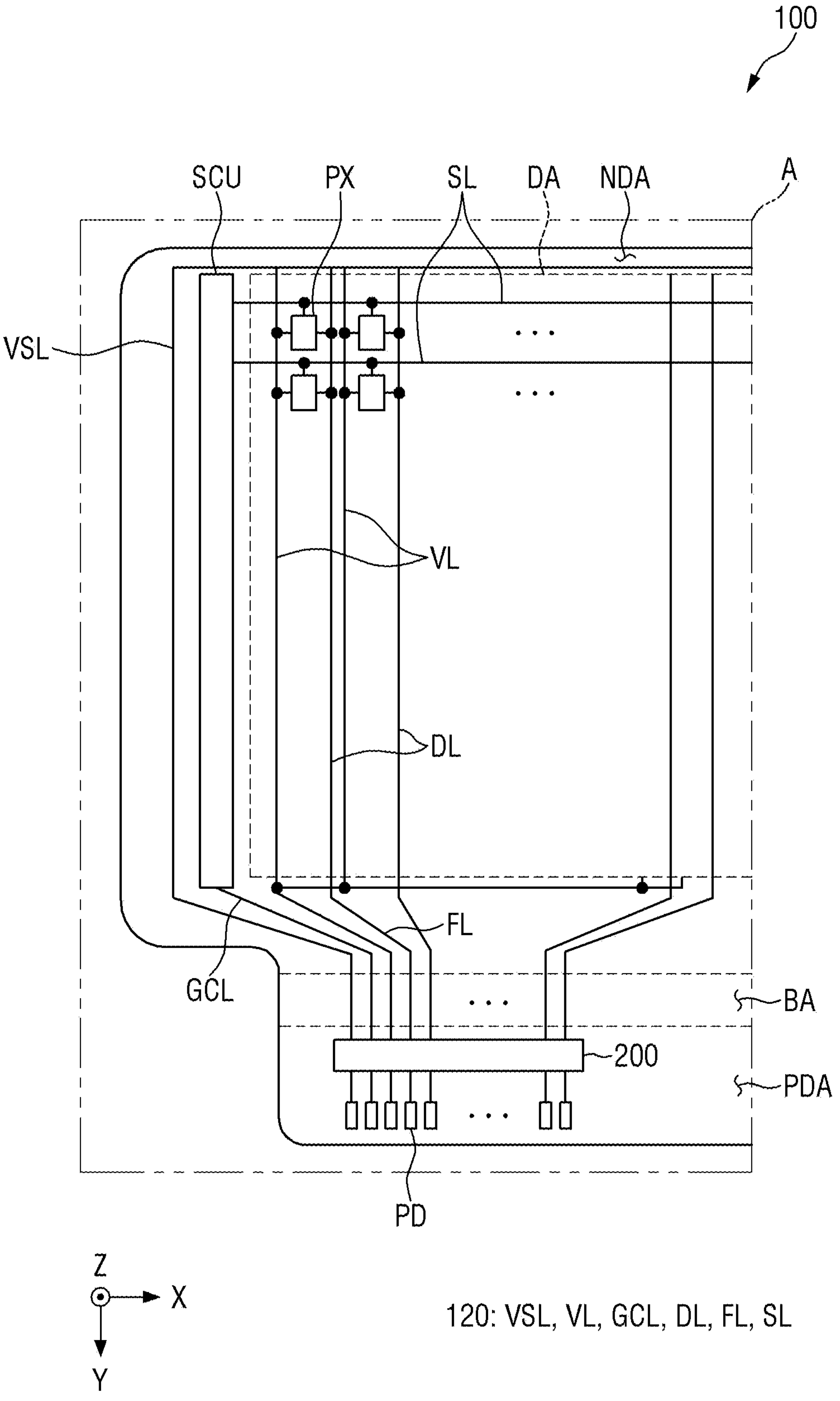
FIG. 6 is an enlarged plan view of a region "A" of FIG. 2.

FIG. 6 is an enlarged plan view of a region "A" of FIG. 2.

Referring to FIG. 6, the display panel 100 may include a plurality of pixels PX and the signal lines 120.

The pixels PX may be located in the display area DA. Each of the pixels PX may be connected to the signal line 120. In an embodiment, the signal line 120 may include a plurality of scan lines SL, a plurality of data lines DL, a plurality of power lines VL, fan-out lines FL, scan control lines GCL, and the like.

The plurality of scan lines SL, the plurality of data lines DL, and the plurality of power lines VL may be located in the display area DA. By way of example, each of the pixels PX may be connected to any two of the scan lines SL, any one of the power lines VL, and any one of the data lines DL. Each of the plurality of pixels PX may be defined as a minimum unit that emits light.

The plurality of scan lines SL may supply signals received from a scan driving controller SCU to the plurality of pixels PX. The plurality of scan lines SL may extend in the first direction (X-axis direction) and may be spaced apart from each other in the second direction (Y-axis direction) intersecting the first direction (X-axis direction).

The plurality of data lines DL may supply the data voltages received from the display driver 200 to the plurality of pixels PX. The plurality of data lines DL may extend in the second direction (Y-axis direction) and may be spaced apart from each other in the first direction (X-axis direction).

The plurality of power lines VL may supply the power voltage received from the display driver 200 to the plurality of pixels PX through the driving voltage line VSL. Here, the power voltage may be at least one of a driving voltage, an initialization voltage, a reference voltage, or a low potential voltage. The plurality of power lines VL may extend in the second direction (Y-axis direction) and may be spaced apart from each other in the first direction (X-axis direction).

The scan driving controller SCU, the driving voltage line VSL, the fan-out line FL, and the scan control line GCL may be located in the non-display area NDA.

The scan driving controller SCU may receive a scan timing signal from the display driver 200, generate scan signals according to the scan timing signal, and output the scan signals to the scan lines SL.

The fan-out lines FL may extend from the display driver 200 to the display area DA. The fan-out lines FL may supply the data voltages received from the display driver 200 to the plurality of data lines DL. In other words, the display driver 200 may output signals and voltages for driving the display panel 100 to the fan-out lines FL, and the display driver 200 may supply the data voltages to the data lines DL through the fan-out lines FL. Accordingly, the data voltages supplied through the data lines DL may be supplied to the plurality of pixels PX to control a luminance of the plurality of pixels PX.

The scan control line GCL may extend from the display driver 200 to the scan driving controller SCU. The scan control line GCL may supply a scan control signal received from the display driver 200 to the scan driving controller SCU.

The driving voltage line VSL may be connected to the plurality of power lines VL, and power may be applied more uniformly to the pixels PX in the display area DA through the plurality of power lines VL connected to the driving voltage line VSL.

The plurality of driving voltage lines VSL, the plurality of scan control lines GCL, and the plurality of fan-out lines FL may extend to the bending area BA. Further, the plurality of driving voltage lines VSL, the plurality of scan control lines GCL, and the plurality of fan-out lines FL may extend to the pad area PDA and be connected to the display driver 200.

Figure 7:
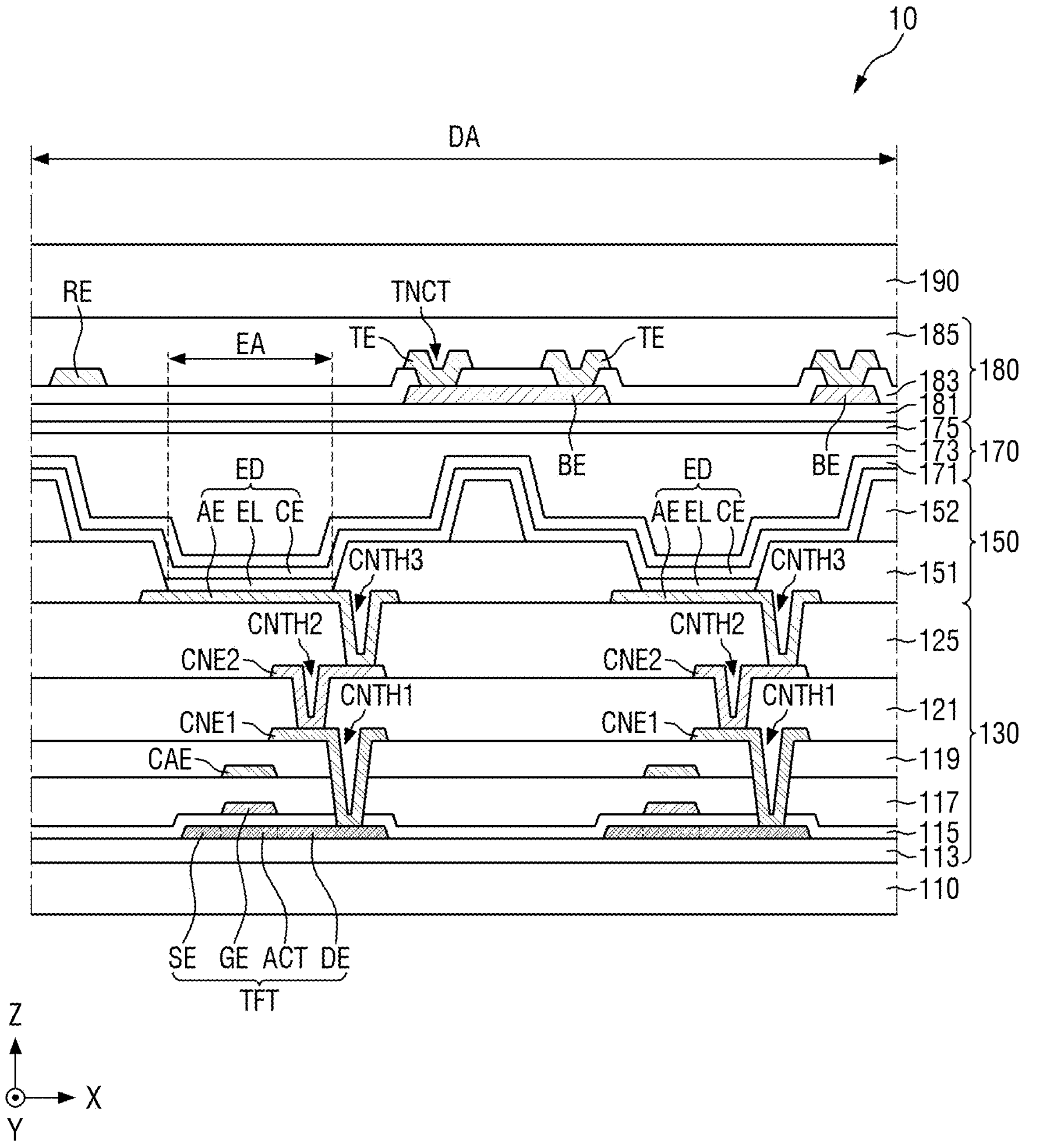
FIG. 7 is a cross-sectional view illustrating an example of a display area of a display device according to an embodiment.

FIG. 7 is a cross-sectional view illustrating an example of the display area DA of the display device 10 according to an embodiment. Since the substrate 110 has already been described, further description thereof will be omitted.

Referring to FIG. 7, the thin film transistor layer 130 may include a buffer layer 113, the thin film transistor TFT, a gate insulating layer 115, a first insulating layer 117, a second insulating layer 119, a first via layer 121, a first connection electrode CNE1, a second connection electrode CNE2, and a second via layer 125.

The buffer layer 113 may be disposed on the substrate 110. The buffer layer 113 may include an inorganic material capable of preventing or substantially preventing permeation of air or moisture. For example, the buffer layer 113 may include a plurality of inorganic layers laminated alternately. For example, the buffer layer 113 may be formed of an inorganic material, such as any of a silicon nitride layer, a silicon oxynitride layer, a silicon oxide layer, a titanium oxide layer, and an aluminum oxide layer. In another embodiment, the buffer layer 113 may be formed of multiple layers in which a plurality of layers of a silicon nitride layer, a silicon oxynitride layer, a silicon oxide layer, a titanium oxide layer, and an aluminum oxide layer are alternately stacked.

The thin film transistor TFT may be disposed on the buffer layer 113, and may constitute a pixel circuit of each of the plurality of pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE. The semiconductor layer ACT may overlap the gate electrode GE in a thickness direction, and may be insulated from the gate electrode GE by the gate insulating layer 115. In a part of the semiconductor layer ACT, a material of the semiconductor layer ACT may be made into a conductor to form the source electrode SE and the drain electrode DE. In an embodiment, the semiconductor layer ACT may include polycrystalline silicon, but the present disclosure is not limited thereto. For example, the semiconductor layer ACT may include amorphous silicon, or the like.

The gate insulating layer 115 may be disposed on the semiconductor layer ACT. For example, the gate insulating layer 115 may cover the semiconductor layer ACT, the source electrode SE, the drain electrode DE, and the buffer layer 113, and may insulate the semiconductor layer ACT from the gate electrode GE. The gate insulating layer 115 may be disposed to have a substantially constant thickness along the profile of the thin film transistor TFT. The gate insulating layer 115 may include an inorganic insulating material and may be formed as a plurality of layers. For example, the gate insulating layer 115 may be formed of an inorganic material, such as any of a silicon nitride layer, a silicon oxynitride layer, a silicon oxide layer, a titanium oxide layer, and an aluminum oxide layer. In another embodiment, the buffer layer 113 may be formed of multiple layers in which a plurality of layers of a silicon nitride layer, a silicon oxynitride layer, a silicon oxide layer, a titanium oxide layer, and an aluminum oxide layer are alternately stacked. Further, the gate insulating layer 115 may include a first contact hole CNTH1 through which the first connection electrode CNE1 passes.

The gate electrode GE may be disposed on the gate insulating layer 115. The gate electrode GE may overlap the semiconductor layer ACT with the gate insulating layer 115 interposed therebetween. The gate electrode GE may include a metal. For example, the gate electrode GE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first insulating layer 117 may be disposed on the gate electrode GE. In an embodiment, the first insulating layer 117 may include an inorganic insulating material and may be formed as a plurality of layers. For example, the first insulating layer 117 may be formed of a silicon nitride layer, a silicon oxynitride layer, a silicon oxide layer, a titanium oxide layer, or an aluminum oxide layer. The first insulating layer 117 may include a first contact hole CNTH1 through which the first connection electrode CNE1 passes.

A capacitor electrode CAE may be disposed on the first insulating layer 117. The capacitor electrode CAE may overlap the gate electrode GE of the thin film transistor TFT in the third direction (Z-axis direction). In an embodiment, the first insulating layer 117 has a permittivity (e.g., a predetermined permittivity), and a capacitor may be formed by the first insulating layer 117 disposed between the capacitor electrode CAE and the gate electrode GE. The capacitor electrode CAE may include metal. For example, the capacitor electrode CAE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 119 may be positioned on the first insulating layer 117 and the capacitor electrode CAE. The second insulating layer 119 may include an inorganic insulating material and may be formed as a plurality of layers. For example, the second insulating layer 119 may be formed of a silicon nitride layer, a silicon oxynitride layer, a silicon oxide layer, a titanium oxide layer, or an aluminum oxide layer. The second insulating layer 119 may include a first contact hole CNTH1 through which the first connection electrode CNE1 passes.

The first connection electrode CNE1 may be disposed on the second insulating layer 119. The first connection electrode CNE1 may electrically connect the drain electrode DE of the thin film transistor TFT to the second connection electrode CNE2. The first connection electrode CNE1 may be inserted in the first contact hole CNTH1 formed in the first insulating layer 117, the second insulating layer 119, and the gate insulating layer 115 to be in contact with the drain electrode DE of the thin film transistor TFT.

The first via layer 121 may cover the first connection electrode CNE1 and the second insulating layer 119. The first via layer 121 may protect the thin film transistor TFT. In an embodiment, the first via layer 121 may include an organic material. For example, the first via layer 121 may include an organic material such as acrylic resin, epoxy resin, phenol resin, polyamide resin, or polyimide resin. The first via layer 121 may include a second contact hole CNTH2 through which the second connection electrode CNE2 passes.

The second connection electrode CNE2 may be disposed on the first via layer 121. The second connection electrode CNE2 may electrically connect the first connection electrode CNE1 to a pixel electrode AE of the light emitting element ED. The second connection electrode CNE2 may be in contact with the first connection electrode CNE1 through the second contact hole CNTH2 formed in the first via layer 121.

The second via layer 125 may be positioned on the second connection electrode CNE2 and the first via layer 121. The second via layer 125 may cover the second connection electrode CNE2 and the first via layer 121. In an embodiment, the second via layer 125 may include an organic material. For example, the second via layer 125 may include an organic material such as acrylic resin, epoxy resin, phenol resin, polyamide resin, or polyimide resin. The second via layer 125 may include a third contact hole CNTH3 through which the pixel electrode AE of the light emitting element ED passes.

The display element layer 150 may be disposed on the thin film transistor layer 130. The display element layer 150 may include the light emitting element ED, the pixel defining layer 151, and a spacer 152.

The light emitting element ED may be located on the second via layer 125. The light emitting element ED may include the pixel electrode AE, a light emitting layer EL, and a common electrode CE.

The pixel electrode AE may be located in each of a plurality of emission areas EA. That is, the pixel electrodes AE overlapping the emission areas EA may be disposed to be spaced apart from each other on the second via layer 125. The pixel electrode AE may be electrically connected to the drain electrode DE of the thin film transistor TFT through the first and second connection electrodes CNE1 and CNE2.

The pixel electrode AE may be a metal having high electrical conductivity. For example, the pixel electrode AE may have a stacked structure formed by stacking a material layer having a high work function, such as any of indium tin oxide (ITO), indium zinc oxide (IZO), zinc oxide (ZnO), and indium oxide ($In_2O_3$), and a reflective material layer, such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof. The layer having a high work function may be disposed above the reflective material layer and disposed closer to the light emitting layers EL1, EL2, and EL3. For example, the pixel electrode AE may have a multilayer structure of ITO/Mg, ITO/MgF, ITO/Ag, and ITO/Ag/ITO, but is not limited thereto.

The pixel defining layer 151 may define the emission area EA. The pixel defining layer 151 may expose a part of the pixel electrode AE on the second via layer 125 and cover an edge of the pixel electrode AE. In an embodiment, the pixel defining layer 151 may include an organic material. For example, the pixel defining layer 151 may include an organic material such as acrylic resin, epoxy resin, phenol resin, polyamide resin, or polyimide resin. The pixel defining layer 151 may be disposed in the third contact hole CNTH3. That is, the third contact hole CNTH3 may be filled with the pixel defining layer 151.

The spacer 152 may be disposed on the pixel defining layer 151. The spacer 152 may support a mask during a process of manufacturing the light emitting layer EL. In an embodiment, the spacer 152 may include an organic material. For example, the spacer 152 may include an organic material such as acrylic resin, epoxy resin, phenol resin, polyamide resin, or polyimide resin.

The light emitting layer EL may be located on the pixel electrode AE while overlapping the emission area EA. The light emitting layer EL may include an organic material to emit light in a certain color (e.g., a predetermined color). For example, the light emitting layer EL may include a hole transporting layer, an organic material layer, and an electron transporting layer. The organic material layer may include a host and a dopant. The organic material layer may include a material that emits light (e.g., predetermined light), and may be formed using a phosphorescent material or a fluorescent material.

The common electrode CE may be located on the light emitting layer EL. The common electrode CE may cover the light emitting layer EL and the pixel defining layer 151. In an embodiment, the common electrode CE may be a common layer formed on the entire surface of the plurality of emission areas EA and the pixel defining layer 151. The common electrode CE may include a transparent conductive material, such that the light generated in the light emitting layer EL may be emitted. The common electrode CE may receive the common voltage or a low potential voltage. When the pixel electrode AE receives a voltage corresponding to a data voltage and the common electrode CE receives the low potential voltage, a potential difference is formed between the pixel electrode AE and the common electrode CE, such that the light emitting layer EL may emit light.

The common electrode CE may be formed of a transparent conductive material (TCO), such as ITO or IZO, that can transmit light or a semi-transmissive conductive material, such as magnesium (Mg), silver (Ag), or an alloy of Mg and Ag. When the common electrode CE is formed of a semi-transmissive conductive material, the light emission efficiency can be increased due to a micro-cavity effect.

The thin film encapsulation layer 170 may be disposed on the display element layer 150. The thin film encapsulation layer 170 may include at least one inorganic layer to prevent or substantially prevent oxygen or moisture from permeating into the display element layer 150. In addition, the thin film encapsulation layer 170 may include at least one organic layer to protect the display element layer 150 from foreign substances such as dust. In an embodiment, the thin film encapsulation layer 170 may include a first encapsulation layer 171, a second encapsulation layer 173, and a third encapsulation layer 175. The first encapsulation layer 171 may be disposed on the common electrode CE, the second encapsulation layer 173 may be disposed on the first encapsulation layer 171, and the third encapsulation layer 175 may be disposed on the second encapsulation layer 173.

The first encapsulation layer 171 and the third encapsulation layer 175 may be inorganic layers. For example, the first encapsulation layer 171 and the third encapsulation layer 175 may be formed as multiple layers in which one or more inorganic layers of a silicon nitride layer, a silicon oxynitride layer, a silicon oxide layer, a titanium oxide layer, and an aluminum oxide layer are alternately stacked.

The second encapsulation layer 173 may be an organic layer. For example, the second encapsulation layer 173 may include an organic material, such as acrylic resin, epoxy resin, phenol resin, polyamide resin, or polyimide resin.

The touch sensor layer 180 may be disposed on the thin film encapsulation layer 170. In an embodiment, the touch sensor layer 180 may include a first touch buffer layer 181, a connection electrode BE, a touch insulating layer 183, touch electrodes TE and RE, and a touch protection layer 185.

The first touch buffer layer 181 may be disposed on the thin film encapsulation layer 170. In an embodiment, the first touch buffer layer 181 may include at least one inorganic layer. For example, the first touch buffer layer 181 may be formed as multiple layers in which one or more inorganic layers of a silicon nitride layer, a silicon oxynitride layer, a silicon oxide layer, a titanium oxide layer, and an aluminum oxide layer are alternately stacked. However, in an embodiment, the first touch buffer layer 181 may be omitted.

The connection electrodes BE may be disposed on the first touch buffer layer 181. In an embodiment, the connection electrodes BE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The touch insulating layer 183 may be disposed on the connection electrodes BE. The touch insulating layer 183 may be formed of an inorganic layer, for example, a silicon nitride layer, a silicon oxynitride layer, a silicon oxide layer, a titanium oxide layer, or an aluminum oxide layer.

The touch electrodes TE and RE may include a driving electrode TE and a sensing electrode RE. The driving electrodes TE and the sensing electrodes RE may be disposed on the touch insulating layer 183. In an embodiment, the driving electrodes TE and the sensing electrodes RE may not overlap the emission areas EA. In an embodiment, the driving electrodes TE and the sensing electrodes RE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO. The driving electrodes TE may be electrically connected to the connection electrode BE through a touch contact hole TNCT.

The touch protection layer 185 may be disposed on the driving electrodes TE and the sensing electrodes RE. The touch protection layer 185 may include at least one of an inorganic layer or an organic layer. In an embodiment, the inorganic layer may be a silicon nitride layer, a silicon oxynitride layer, a silicon oxide layer, a titanium oxide layer, or an aluminum oxide layer. The organic layer may include an organic material, such as acrylic resin, epoxy resin, phenol resin, polyamide resin, or polyimide resin.

The polarizing film 190 may be disposed on the touch sensor layer 180. The polarizing film 190 may be disposed on the display panel 100 to reduce reflection of external light. In an embodiment, the polarizing film 190 may include a first base member, a linear polarization plate, a phase retardation film, such as a quarter-wave plate (λ/4 plate), and a second base member. The first base member, the phase retardation film, the linear polarization plate, and the second base member of the polarizing film 190 may be sequentially stacked on the display panel 100.

Figure 8:
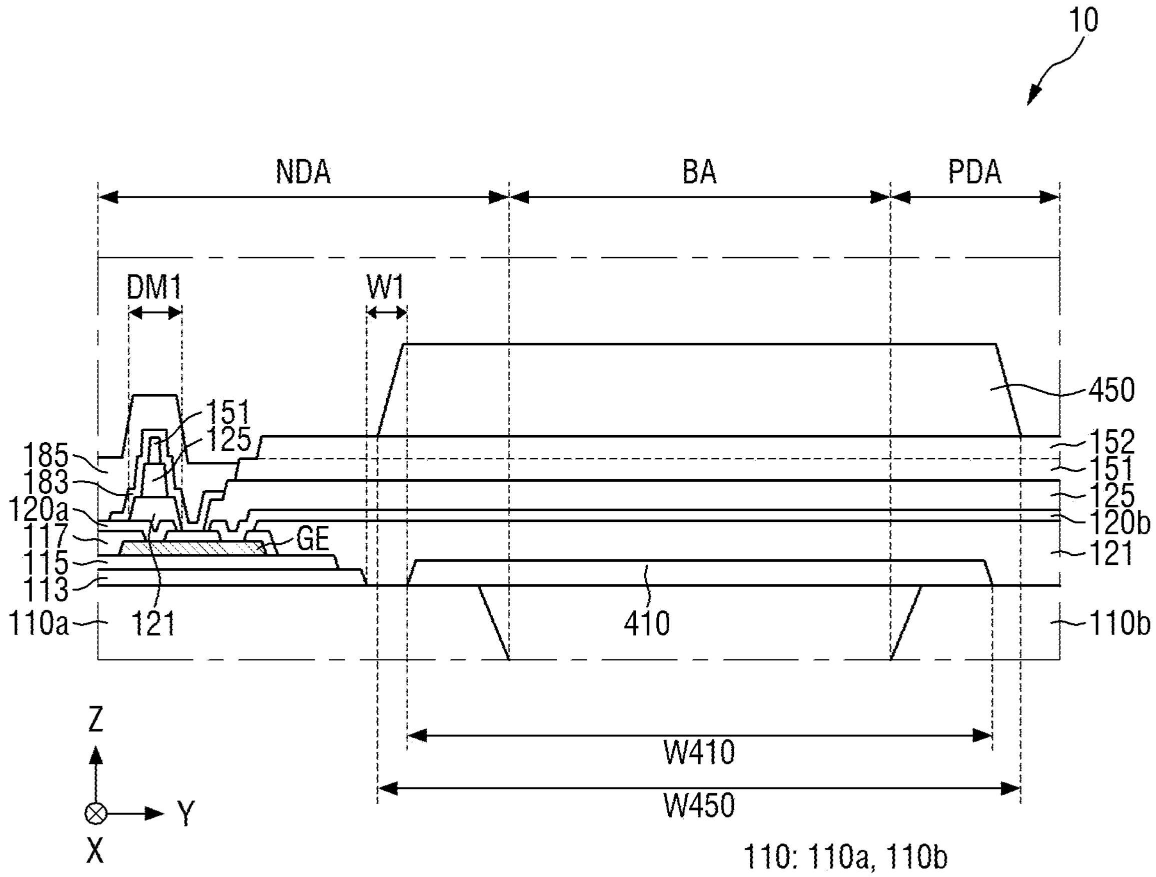
FIG. 8 is a cross-sectional view illustrating an example of a non-display area, a bending area, and a pad area in a display device according to an embodiment.

FIG. 8 is a cross-sectional view illustrating an example of the non-display area NDA, the bending area BA, and the pad area PDA in the display device 10 according to an embodiment.

Referring to FIG. 8, the buffer layer 113 may be located on the first substrate 110*a* while overlapping the non-display area NDA, and the gate insulating layer 115 may be located on the buffer layer 113. The buffer layer 113 and the gate insulating layer 115 may extend from the display area DA. As described above, the buffer layer 113 and the gate insulating layer 115 may include an inorganic insulating material.

The gate electrode GE may be located on the gate insulating layer 115 while overlapping the non-display area NDA. The gate electrode GE overlapping the non-display area NDA may be in contact with the signal line 120 located on the gate electrode GE.

The signal line 120 may be located on the gate electrode GE while overlapping the non-display area NDA. The signal line 120 may be divided into a first portion 120*a* located on the second side in the second direction (Y-axis direction) and a second portion 120*b* located on the first side in the second direction (Y-axis direction). The first portion 120*a* and the second portion 120*b* of the signal line 120 may be spaced apart from each other with the first insulating layer 117 therebetween, and may be electrically connected to each other through the gate electrode GE.

In some embodiments, the signal line 120 may include electrodes and wires located in the thin film transistor layer 130 and all electrodes and wires located in the touch sensor layer 180. That is, a plurality of electrodes and wires located in different layers in the display area DA may be combined into the signal line 120.

The first dam DM1 may be located on the first portion 120*a* of the signal line 120 and the first insulating layer 117 while overlapping the non-display area NDA. The first dam DM1 may be composed of the first via layer 121, the second via layer 125, and the pixel defining layer 151. That is, the first dam DM1 may be made of an organic material. As described above, the first dam DM1 and the second dam DM2 may prevent or substantially prevent the organic material applied to the display area DA from flowing into the bending area BA and the pad area PDA.

The touch insulating layer 183 may be located on the first portion 120*a* of the signal line 120, the first dam DM1, and the first insulating layer 117 while overlapping the non-display area NDA. In an embodiment, the touch insulating layer 183 may completely cover the first dam DM1. Although not shown in the drawings, a plurality of electrodes and wires included in the touch sensor layer 180 may be combined into the signal line 120.

The touch protection layer 185 may be located on the touch insulating layer 183 while overlapping the non-display area NDA. The touch protection layer 185 may cover the first dam DM1 and the touch insulating layer 183.

The first wiring protection layer 410 may be located on the substrate 110 while overlapping the non-display area NDA, the bending area BA, and the pad area PDA. The first wiring protection layer 410 may be spaced apart from the buffer layer 113 and the gate insulating layer 115 in the second direction (Y-axis direction). That is, the first wiring protection layer 410 may be spaced apart from an inorganic layer located in the display area DA in the second direction (Y-axis direction). In an example, a separation gap between the buffer layer 113 and the first wiring protection layer 410 is defined as a first gap W1, and the first gap W1 may be equal to or greater than 2 μm.

The first via layer 121 may be located on the first wiring protection layer 410 while overlapping the non-display area NDA, the bending area BA, and the pad area PDA. As described above, the first via layer 121 may include an organic material. In an embodiment, the first via layer 121 may completely cover the first wiring protection layer 410, and the first via layer 121 may be in contact with the first wiring protection layer 410.

The second portion 120*b* of the signal line 120 may be located on the first via layer 121 while overlapping the non-display area NDA, the bending area BA, and the pad area PDA. A plurality of electrodes and wires included in the second portion 120*b* of the signal line 120 may be connected to the plurality of display pads PD located in the pad area PDA.

The second via layer 125 may be located on the second portion 120*b* of the signal line 120 while overlapping the non-display area NDA, the bending area BA, and the pad area PDA. As described above, the second via layer 125 may include an organic material. The second via layer 125 may overlap the first wiring protection layer 410.

The pixel defining layer 151 may be located on the second via layer 125 while overlapping the non-display area NDA, the bending area BA, and the pad area PDA. As described above, the pixel defining layer 151 may include an organic material. The pixel defining layer 151 may overlap the first wiring protection layer 410.

The spacer 152 may be located on the pixel defining layer 151 while overlapping the non-display area NDA, the bending area BA, and the pad area PDA. As described above, the spacer 152 may include an organic material. The spacer 152 may overlap the first wiring protection layer 410.

The bending protection layer 450 may be located on the spacer 152 while overlapping the non-display area NDA, the bending area BA, and the pad area PDA. The bending protection layer 450 may not only protect a lower structure overlapping the bending area BA from external foreign substances by overlapping the bending area BA, but may also adjust a neutral plane to prevent or substantially prevent cracks from occurring when the signal line 120 overlapping the bending area BA is bent.

Accordingly, the signal line 120 overlapping the bending area BA of the display device 10 may be protected from stress occurring during bending by the bending protection layer 450 and, further, may be protected from an etchant included in a manufacturing process by the first wiring protection layer 410. The bending protection layer 450 may overlap the first wiring protection layer 410.

In some embodiments, a width W410 of the first wiring protection layer 410 in the second direction (Y-axis direction) may be smaller than a width W450 of the bending protection layer 450. Accordingly, the first wiring protection layer 410 may be located at an inner side of the bending protection layer 450 in the second direction (Y-axis direction).

Figure 9:
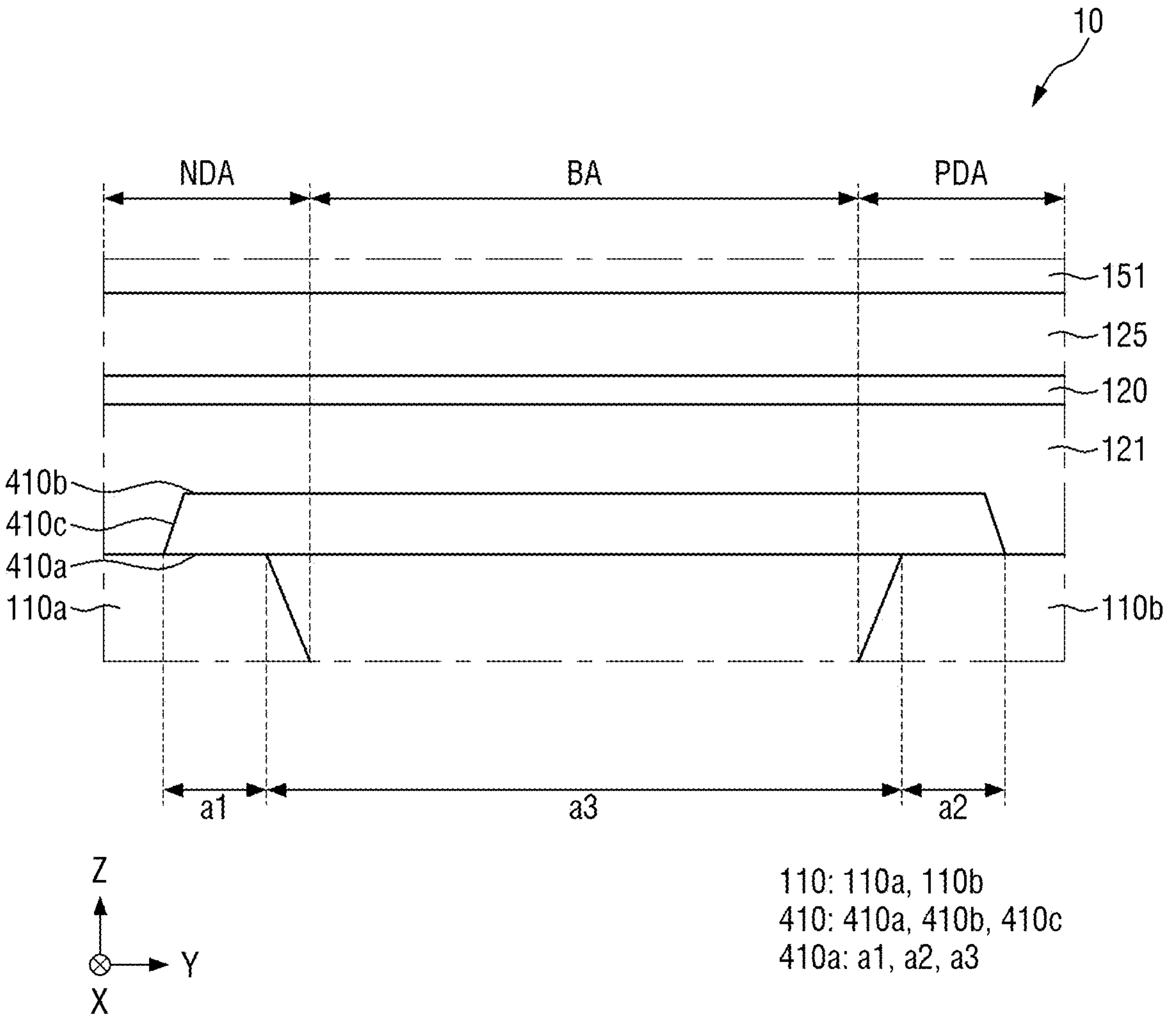
FIG. 9 is an enlarged cross-sectional view of a first wiring protection layer of FIG. 8.

FIG. 9 is an enlarged cross-sectional view of the first wiring protection layer 410 of FIG. 8.

Referring to FIG. 9, the first wiring protection layer 410 may include a top surface 410*b*, a bottom surface 410*a*, and a side surface 410*c*.

In some embodiments, the bottom surface 410*a* of the first wiring protection layer 410 may be a surface facing the substrate 110. The bottom surface 410*a* of the first wiring protection layer 410 may include a first portion a1, a second portion a2, and a third portion a3 depending on a contact structure.

The first portion a1 of the bottom surface 410*a* included in the first wiring protection layer 410 may be in contact with the first substrate 110*a* and may overlap the non-display area NDA. Further, the second portion a2 of the bottom surface 410*a* may be in contact with the second substrate 110*b* and may overlap the pad area PDA. Further, the third portion a3 of the bottom surface 410*a* may be an exposed portion that is not in contact with the substrate 110 and may overlap the bending area BA. The top surface 410*b* of the first wiring protection layer 410 may be a surface opposite to the bottom surface 410*a* and in contact with the first via layer 121. The side surface 410*c* of the first wiring protection layer 410 may be a surface connecting the top surface 410*b* to the bottom surface 410*a*, and may be located on both, or opposite, sides of the first wiring protection layer 410.

Figure 10:
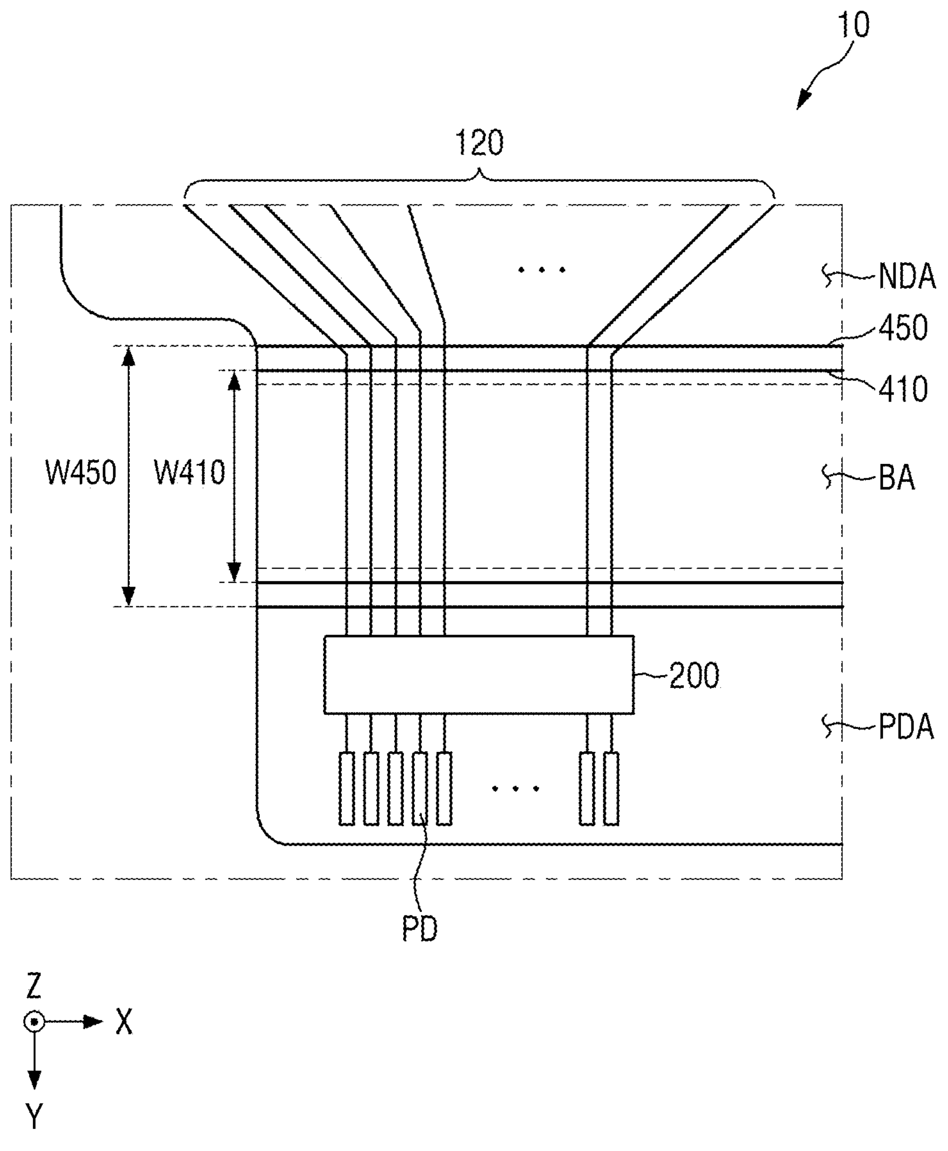
FIG. 10 is an enlarged plan view of a bending area of FIG. 6.

FIG. 10 is an enlarged plan view of the bending area of FIG. 6.

Referring to FIG. 10, in a plan view, the first wiring protection layer 410 of the display device 10 may extend from the bending area BA to parts of the non-display area NDA and the pad area PDA. That is, the first wiring protection layer 410 of the display device 10 may overlap the non-display area NDA and the pad area PDA in a plan view. In an embodiment, the first wiring protection layer 410 of the display device 10 may overlap the bending area BA to completely cover the signal line 120 in a plan view.

In addition, in a plan view, the bending protection layer 450 of the display device 10 may extend from the bending area BA to parts of the non-display area NDA and the pad area PDA. That is, the bending protection layer 450 of the display device 10 may overlap the non-display area NDA and the pad area PDA in a plan view. In an embodiment, the bending protection layer 450 of the display device 10 may overlap the bending area BA to completely cover the signal line 120 in a plan view.

By way of example, the width W410 of the first wiring protection layer 410 in the second direction (Y-axis direction) may be smaller than the width W450 of the bending protection layer 450. In an embodiment, in a plan view, the bending protection layer 450 may overlap the non-display area NDA, the bending area BA, and the pad area PDA to completely cover the first wiring protection layer 410.

Figure 11:
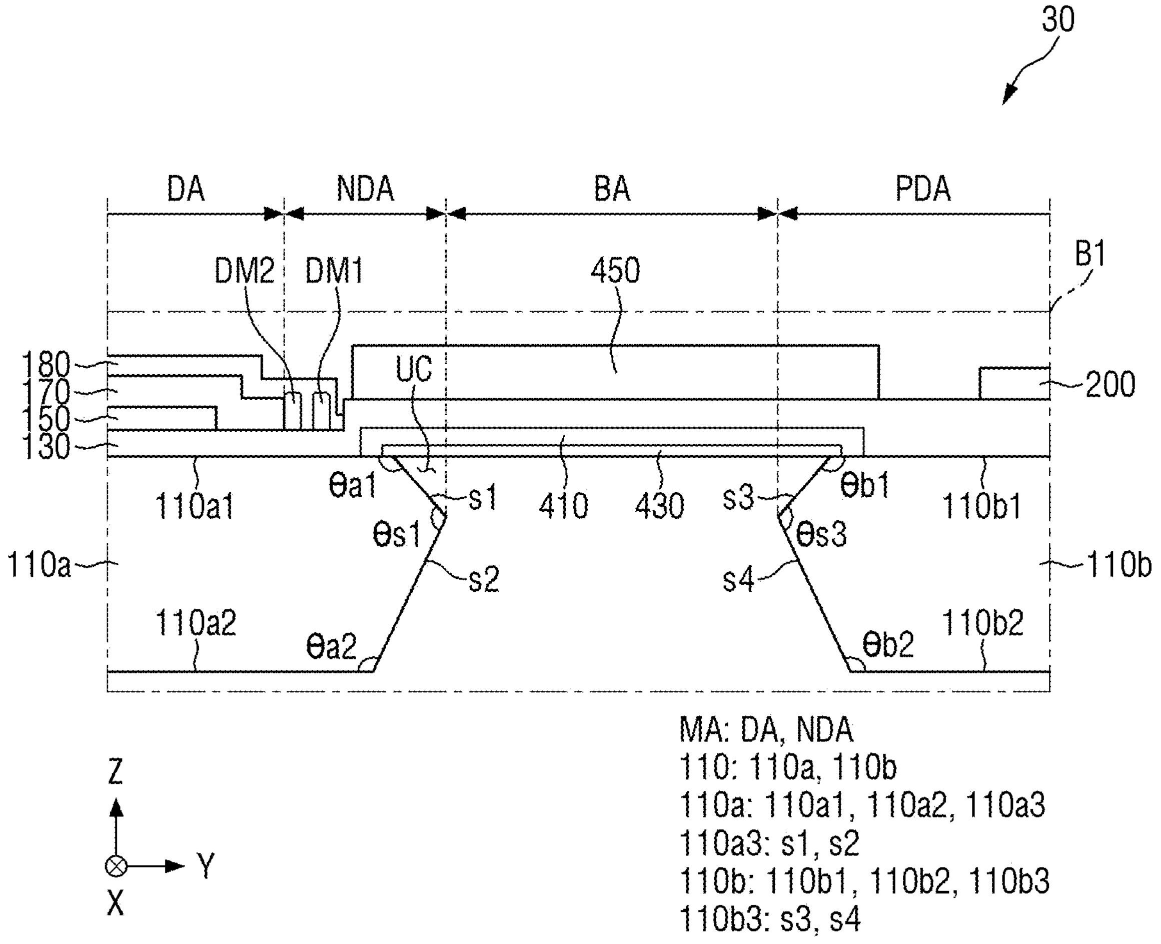
FIG. 11 is an enlarged cross-sectional view of a region corresponding to the region "B1" of FIG. 3, according to another embodiment.

FIG. 11 is an enlarged cross-sectional view of a region corresponding to the region "B1" of FIG. 3, according to another embodiment.

Referring to FIG. 11, a display device 30 differs from the display device 10 of the previously described embodiment in that a second wiring protection layer 430 is located between the substrate 110 and the first wiring protection layer 410 while overlapping the non-display area NDA, the bending area BA, and the pad area PDA.

The substrate 110 of the display device 30 may include the first substrate 110*a* and the second substrate 110*b*, and the first substrate 110*a* may include the first inclined surface s1 and the second inclined surface s2 facing the bending area BA. In addition, the second substrate 110*b* may include the first inclined surface s3 and the second inclined surface s4 facing the bending area BA. Repeated descriptions thereof will be omitted.

The second wiring protection layer 430 may be located on the substrate 110 while overlapping the non-display area NDA and the pad area PDA. The second wiring protection layer 430 may be located to overlap the bending area BA and may extend to the non-display area NDA and the pad area PDA. A first side of the second wiring protection layer 430 may be in contact with the second substrate 110*b*, and a second side of the second wiring protection layer 430 may be in contact with the first substrate 110*a*. The second wiring protection layer 430 may be located to overlap the first inclined surface s1 and the second inclined surface s2 included in the first substrate 110*a*, and the undercut UC may be formed between the second wiring protection layer 430 and the first inclined surface s1. In addition, the second wiring protection layer 430 may be located to overlap the first inclined surface s3 and the second inclined surface s4 included in the second substrate 110*b*, and the undercut UC may be formed between the second wiring protection layer 430 and the first inclined surface s3.

The second wiring protection layer 430 may protect the signal line 120 overlapping the bending area BA. During a manufacturing process of the display device 30 included in the present embodiment, a part of the substrate 110 overlapping the bending area BA may be etched by applying a high-pressure spray. Accordingly, the display device 30 may include the second wiring protection layer 430 on the substrate 110 to overlap the bending area BA, thereby protecting the signal lines 120 overlapping the bending area BA from cracks and corrosion.

In an embodiment, the second wiring protection layer 430 may include an organic material with good acid resistance properties. In an example, the second wiring protection layer 430 may include polyimide (PI). However, the present disclosure is not limited thereto, and any suitable organic material having acid resistance properties to hydrogen fluoride (HF) may be included.

The first wiring protection layer 410 may be located on the second wiring protection layer 430 in the display device 30. In an embodiment, the first wiring protection layer 410 may completely cover the second wiring protection layer 430.

The first wiring protection layer 410 may be located to overlap the bending area BA, and may extend to the non-display area NDA and the pad area PDA. A first side of the first wiring protection layer 410 may extend from the second wiring protection layer 430 to be in contact with the second substrate 110*b*, and a second side of the first wiring protection layer 410 may extend from the second wiring protection layer 430 to be in contact with the first substrate 110*a*. In an embodiment, the first wiring protection layer 410 included in the present embodiment may not overlap the first inclined surface s1 and the second inclined surface s2 included in the first substrate 110*a*, and may also not overlap the first inclined surface s3 and the second inclined surface s4 included in the second substrate 110*b*.

The thin film transistor layer 130 may be located on the substrate 110 and the first wiring protection layer 410 of the display device 30, and the bending protection layer 450 may be located on the thin film transistor layer 130 while overlapping the non-display area NDA, the bending area BA, and the pad area PDA. The bending protection layer 450 of the display device 30 may overlap the first wiring protection layer 410 and the second wiring protection layer 430. Repeated descriptions thereof will be omitted.

Figure 12:
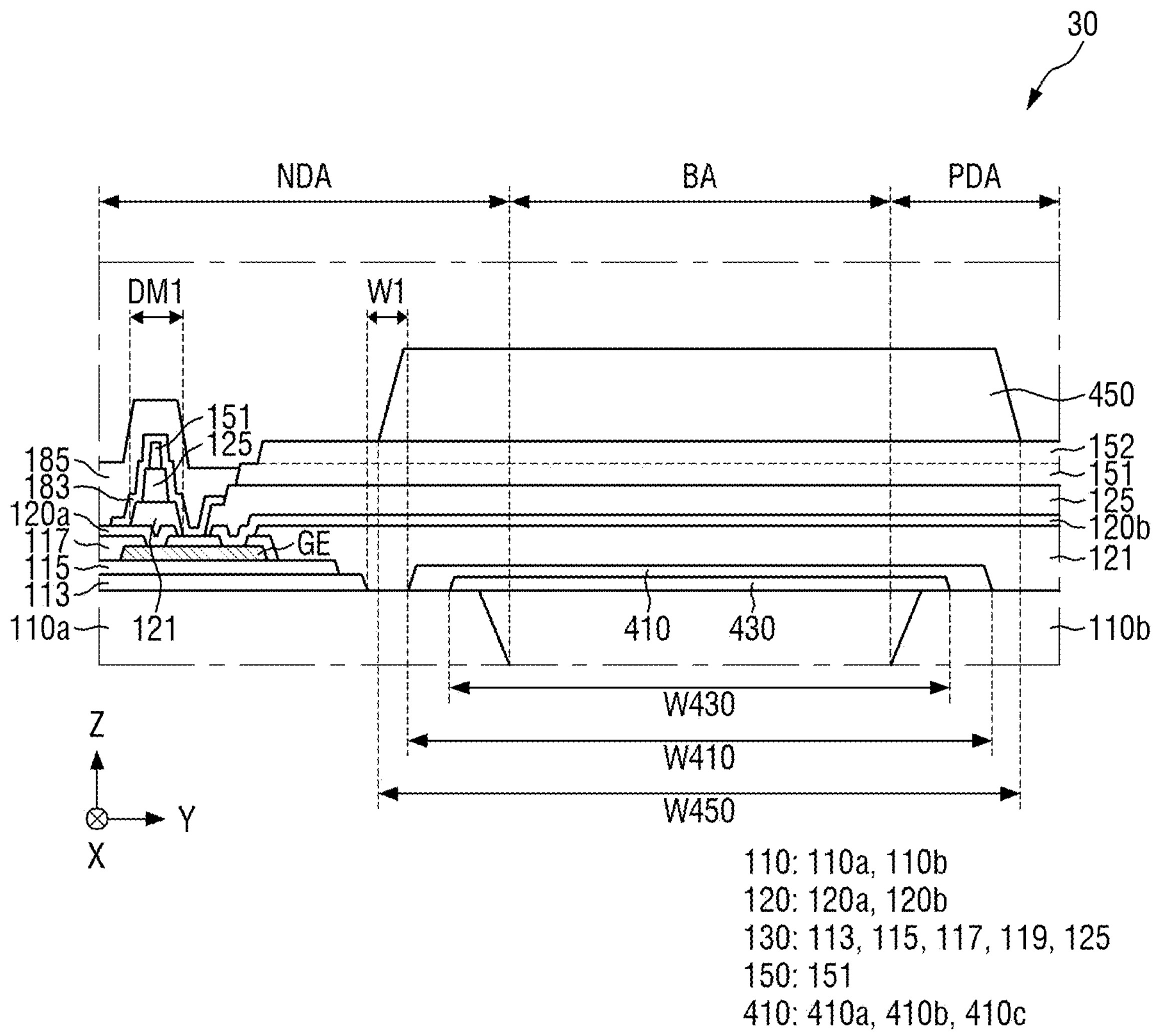
FIG. 12 is an enlarged cross-sectional view of a non-display area, a bending area, and a pad area of FIG. 11.

FIG. 12 is an enlarged cross-sectional view of the non-display area NDA, the bending area BA, and the pad area PDA of FIG. 11.

Referring to FIG. 12, the buffer layer 113 may be located on the first substrate 110*a* while overlapping the non-display area NDA of the display device 30, and the gate insulating layer 115 may be located on the buffer layer 113. The buffer layer 113 and the gate insulating layer 115 may extend from the display area DA. The gate electrode GE may be located on the gate insulating layer 115, and the gate electrode GE may be in contact with the signal line 120 located on the gate electrode GE. The gate electrode GE and the signal line 120 may be spaced apart from each other by the first insulating layer 117. The signal line 120 of the display device 30 may be divided into the first portion 120*a* located on the second side in the second direction (Y-axis direction), and the second portion 120*b* located on the first side in the second direction (Y-axis direction). The signal line 120 of the display device 30 may include a plurality of electrodes and wires included in the thin film transistor layer 130, and a plurality of electrodes and wires included in the touch sensor layer 180. Repeated descriptions thereof will be omitted.

The second wiring protection layer 430 may be located on the substrate 110 while overlapping the non-display area NDA, the bending area BA, and the pad area PDA in the display device 30. The second wiring protection layer 430 of the display device 30 may be in contact with the substrate 110 while overlapping the non-display area NDA and the pad area PDA.

The first wiring protection layer 410 of the display device 30 may be located on the second wiring protection layer 430. In an embodiment, the first wiring protection layer 410 of the display device 30 may completely cover the second wiring protection layer 430. The first wiring protection layer 410 of the display device 30 may be in contact with the substrate 110 while overlapping the non-display area NDA and the pad area PDA.

By way of example, the width W410 of the first wiring protection layer 410 in the second direction (Y-axis direction) may be greater than a width W430 of the second wiring protection layer 430. Accordingly, the second wiring protection layer 430 may be located at an inner side of the first wiring protection layer 410 in the second direction (Y-axis direction).

In some embodiments, the buffer layer 113 and the gate insulating layer 115 located in the non-display area NDA may be spaced apart from the first wiring protection layer 410 in the second direction (Y-axis direction). In other words, the first wiring protection layer 410 may be spaced apart from an inorganic layer located in the non-display area NDA in the second direction (Y-axis direction). In an example, a separation gap between the buffer layer 113 and the first wiring protection layer 410 is defined as the first gap W1, and the first gap W1 may be equal to or greater than 2 μm.

The first via layer 121 may be located on the first wiring protection layer 410 while overlapping the non-display area NDA, the bending area BA, and the pad area PDA in the display device 30. As described above, the first via layer 121 may include an organic material. In an embodiment, the first via layer 121 may completely cover the first wiring protection layer 410, and the first via layer 121 of the display device 30 may overlap the first wiring protection layer 410 and the second wiring protection layer 430.

The second portion 120*b* of the signal line 120 may be located on the first via layer 121 while overlapping the non-display area NDA, the bending area BA, and the pad area PDA in the display device 30. A plurality of electrodes and wires included in the second portion 120*b* of the signal line 120 may be connected to the plurality of display pads PD located in the pad area PDA.

The second via layer 125 may be located on the second portion 120*b* of the signal line 120 while overlapping the non-display area NDA, the bending area BA, and the pad area PDA. As described above, the second via layer 125 may include an organic material. The second via layer 125 of the display device 30 may overlap the first wiring protection layer 410 and the second wiring protection layer 430.

The pixel defining layer 151 may be located on the second via layer 125 while overlapping the non-display area NDA, the bending area BA, and the pad area PDA in the display device 30. As described above, the pixel defining layer 151 may include an organic material. The pixel defining layer 151 of the display device 30 may overlap the first wiring protection layer 410 and the second wiring protection layer 430.

The spacer 152 may be located on the pixel defining layer 151 while overlapping the non-display area NDA, the bending area BA, and the pad area PDA in the display device 30. As described above, the spacer 152 may include an organic material. The spacer 152 of the display device 30 may overlap the first wiring protection layer 410 and the second wiring protection layer 430.

The bending protection layer 450 may be located on the spacer 152 while overlapping the non-display area NDA, the bending area BA, and the pad area PDA in the display device 30. The bending protection layer 450 may not only protect a lower structure overlapping the bending area BA from external foreign substances by overlapping the bending area BA, but may also adjust a neutral plane to prevent or substantially prevent cracks from occurring when the signal line 120 overlapping the bending area BA is bent.

Accordingly, the signal line 120 overlapping the bending area BA of the display device 10 may be protected from stress occurring during bending by the bending protection layer 450 and, further, may be protected from an etchant generated during a manufacturing process by the first wiring protection layer 410 and the second wiring protection layer 430. The bending protection layer 450 of the display device 30 may overlap the first wiring protection layer 410 and the second wiring protection layer 430.

As described above, the width W430 of the second wiring protection layer 430 in the second direction (Y-axis direction) may be smaller than the width W410 of the first wiring protection layer 410 in the second direction (Y-axis direction). In addition, the width W410 of the first wiring protection layer 410 in the second direction (Y-axis direction) may be smaller than the width W450 of the bending protection layer 450. Therefore, in the second direction (Y-axis direction), the second wiring protection layer 430 may be located at an inner side of the first wiring protection layer 410, and the first wiring protection layer 410 may be located at an inner side of the bending protection layer 450. In other words, the first wiring protection layer 410 and the second wiring protection layer 430 may be located at an inner side of the bending protection layer 450.

Figure 13:
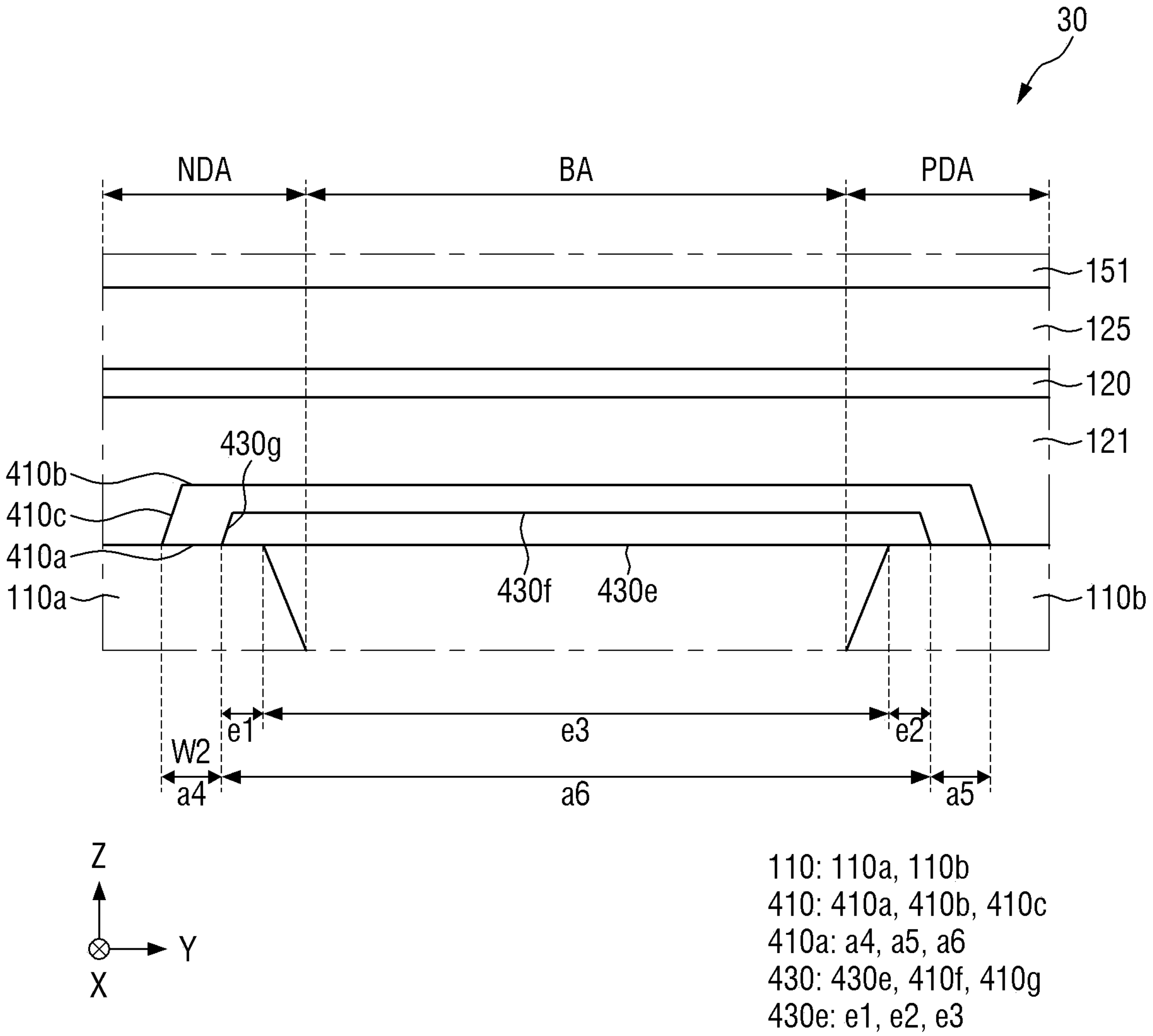
FIG. 13 is an enlarged cross-sectional view of a first wiring protection layer and a second wiring protection layer of FIG. 12.

FIG. 13 is an enlarged cross-sectional view of the first wiring protection layer 410 and the second wiring protection layer 430 of FIG. 12.

Referring to FIG. 13, the second wiring protection layer 430 of the display device 30 may include a bottom surface 430*e*, a top surface 430*f*, and a side surface 430*g*.

The bottom surface 430*e* of the second wiring protection layer 430 may be a surface facing the substrate 110. The bottom surface 430*e* of the second wiring protection layer 430 may be divided into a first portion e1, a second portion e2, and a third portion e3 depending on a contact structure. The first portion e1 of the bottom surface 430*e* included in the second wiring protection layer 430 may be in contact with the first substrate 110*a* and may overlap the non-display area NDA. In addition, the second portion e2 of the bottom surface 430*e* may be in contact with the second substrate 110*b* and may overlap the pad area PDA. In addition, the third portion e3 of the bottom surface 430*e* may be located between the first portion e1 and the second portion e2 and may not overlap the substrate 110. The third portion e3 of the bottom surface 430*e* may be exposed to the outside of the display device 30.

The top surface 430*f* of the second wiring protection layer 430 may be a surface opposite to the bottom surface 430*e* and in contact with the first wiring protection layer 410. The side surface 430*g* of the second wiring protection layer 430 may be a surface connecting the top surface 430*f* to the bottom surface 430*e*.

The first wiring protection layer 410 of the display device 30 may be located on the second wiring protection layer 430, and may completely cover the second wiring protection layer 430.

In some embodiments, the first wiring protection layer 410 of the display device 30 may include the top surface 410*b*, the bottom surface 410*a*, and the side surface 410*c*. The top surface 410*b* of the first wiring protection layer 410 may be a surface in contact with the first via layer 121. The side surface 410*c* of the first wiring protection layer 410 may be a surface connecting the top surface 410*b* of the first wiring protection layer 410 to the bottom surface 410*a* thereof. The bottom surface 410*a* of the first wiring protection layer 410 may be a surface facing the substrate 110 and the second wiring protection layer 430. The bottom surface 410*a* of the first wiring protection layer 410 may be divided into a first portion a4, a second portion a5, and a third portion a6 depending on a contact structure.

The first portion a4 included in the bottom surface 410*a* of the first wiring protection layer 410 may be a surface in contact with the first substrate 110*a* and may overlap the non-display area NDA. In addition, the second portion a5 may be a surface in contact with the second substrate 110*b* and may overlap the pad area PDA. In addition, the third portion a6 may be a surface in contact with the second wiring protection layer 430.

In some embodiments, a width of the first portion a4 included in the bottom surface 410*a* of the first wiring protection layer 410 is defined as a second gap W2, and the second gap W2 may refer to a gap between the side surface 410*c* of the first wiring protection layer 410 and the side surface 430*g* of the second wiring protection layer 430. In an example, the second gap W2 may be equal to or greater than 2 μm. Although not shown in the drawings, the width of the second portion a5 may also be a gap between the side surface 410*c* of the first wiring protection layer 410 and the side surface 430*g* of the second wiring protection layer 430, and the width of the second portion a5 may be equal to or greater than 2 μm.

Figure 14:
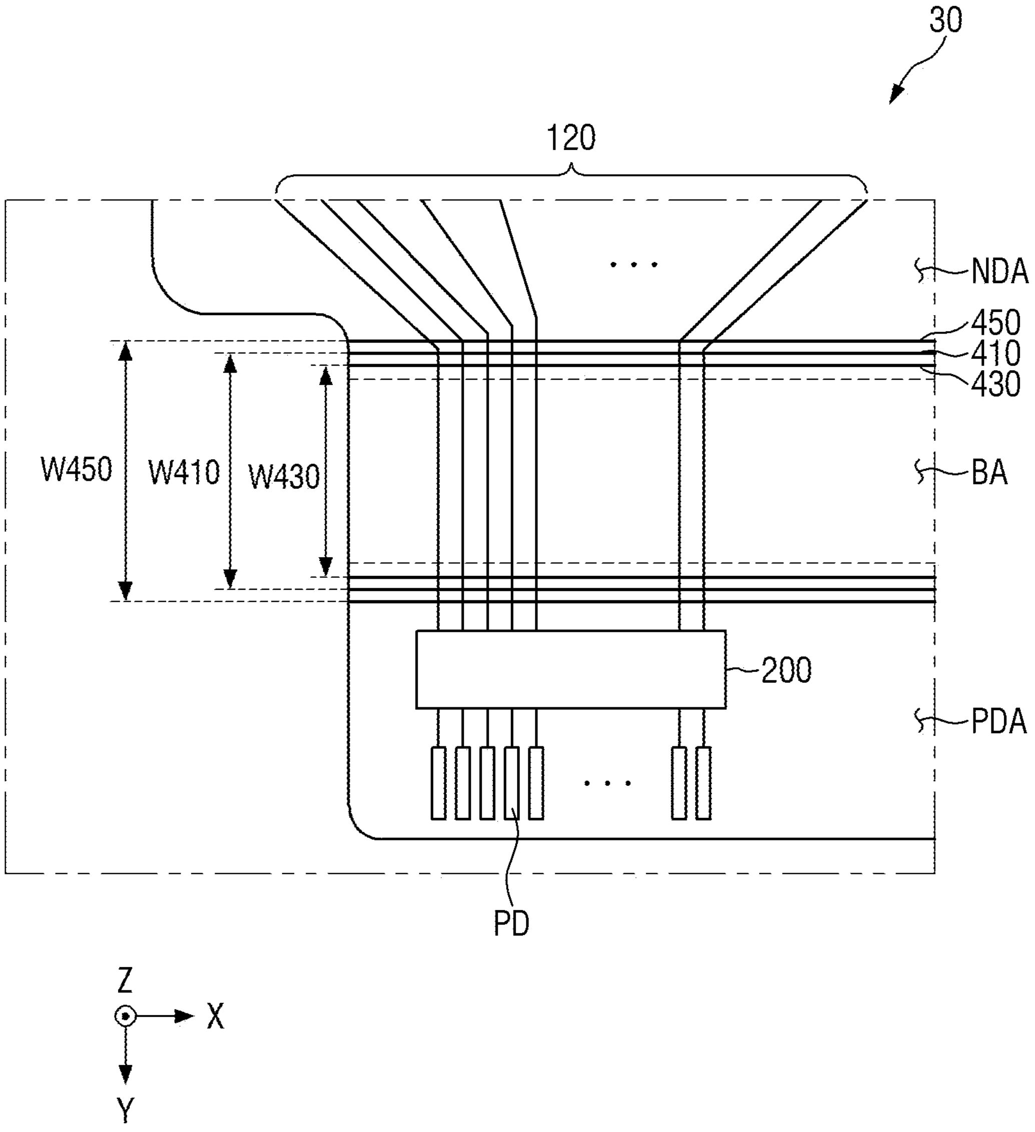
FIG. 14 is an enlarged plan view of a bending area of FIG. 6, according to another embodiment.

FIG. 14 is an enlarged plan view of the bending area BA shown in FIG. 6, according to the embodiment of FIG. 11.

Referring to FIG. 14, the second wiring protection layer 430 of the display device 30 may extend from the bending area BA to parts of the non-display area NDA and the pad area PDA in a plan view. That is, the second wiring protection layer 430 of the display device 30 may overlap the non-display area NDA and the pad area PDA in a plan view. In an embodiment, the second wiring protection layer 430 of the display device 30 may overlap the bending area BA to completely cover the signal line 120 in a plan view.

In a plan view, the first wiring protection layer 410 of the display device 30 may extend from the bending area BA to parts of the non-display area NDA and the pad area PDA. That is, the first wiring protection layer 410 of the display device 30 may overlap the non-display area NDA and the pad area PDA in a plan view. Further, the first wiring protection layer 410 of the display device 30 may overlap the bending area BA to completely cover the signal line 120 in a plan view.

By way of example, the width W430 of the second wiring protection layer 430 in the second direction (Y-axis direction) may be smaller than the width W410 of the first wiring protection layer 410. In an embodiment, in a plan view, the first wiring protection layer 410 may overlap the non-display area NDA, the bending area BA, and the pad area PDA to completely cover the second wiring protection layer 430 in the second direction (Y-axis direction).

In a plan view, the bending protection layer 450 of the display device 30 may extend from the bending area BA to parts of the non-display area NDA and the pad area PDA. That is, the bending protection layer 450 of the display device 30 may overlap the non-display area NDA and the pad area PDA in a plan view. In an embodiment, the bending protection layer 450 of the display device 30 may overlap the bending area BA to completely cover the signal line 120 in a plan view.

By way of example, the width W430 of the second wiring protection layer 430 and the width W410 of the first wiring protection layer 410 in the second direction (Y-axis direction) may be smaller than the width W450 of the bending protection layer 450. Accordingly, in an embodiment, in a plan view, the bending protection layer 450 may overlap the non-display area NDA, the bending area BA, and the pad area PDA to completely cover the first and second wiring protection layers 410 and 430 in the second direction (Y-axis direction).

Features of various embodiments of the present disclosure may be combined partially or totally. As will be clearly appreciated by those skilled in the art, technically various interactions and operations are possible. Also, various embodiments can be practiced individually or in combination.

In concluding the detailed description, those skilled in the art will appreciate that many variations and modifications can be made to the described embodiments without substantially departing from the principles of the invention. Therefore, the disclosed embodiments of the invention are to be understood in a generic and descriptive sense and not for purposes of limitation.

What is claimed is:

1. A display device comprising:

a substrate comprising a main region and a pad area;

a buffer layer on the main region of the substrate;

a first electrode on the buffer layer;

a first wiring protection layer on the substrate, the first wiring protection layer overlapping a bending area located between the main region and the pad area;

a signal line on the first electrode and the first wiring protection layer;

a display element layer on the signal line, the display element layer overlapping the main region; and a bending protection layer on the signal line, the bending protection layer overlapping the bending area, wherein the substrate comprises a first substrate overlapping the main region, and a second substrate spaced apart from the first substrate with the bending area therebetween, and overlapping the pad area, the first wiring protection layer is in contact with the first substrate and the second substrate, and the first wiring protection layer is spaced apart from the buffer layer in a direction parallel to the substrate with a first gap therebetween.

2. The display device of claim 1, wherein the first substrate comprises:

a top surface facing the buffer layer;

a bottom surface opposite to the top surface;

a first inclined surface connected to the top surface and facing the bending area; and a second inclined surface connecting the bottom surface to the first inclined surface, and facing the bending area.

3. The display device of claim 2, wherein an inclination angle formed by the top surface and the first inclined surface and an inclination angle formed by the bottom surface and the second inclined surface are obtuse angles.

4. The display device of claim 2, wherein the first wiring protection layer overlaps the first inclined surface and the second inclined surface.

5. The display device of claim 4, wherein an undercut is formed between the first wiring protection layer and the first inclined surface.

6. The display device of claim 5, wherein the substrate does not overlap the bending area, and a thickness of the substrate is 200 μm or less.

7. The display device of claim 1, wherein the first wiring protection layer comprises a first surface facing the substrate, and the first surface comprises a first portion in contact with the first substrate, a second portion in contact with the second substrate, and a third portion located between the first portion and the second portion and overlapping the bending area.

8. The display device of claim 7, wherein the third portion is exposed to an outside.

9. The display device of claim 1, wherein the first gap is 2 μm or greater.

10. The display device of claim 9, wherein the first wiring protection layer comprises an inorganic layer containing silicon.

11. The display device of claim 10, wherein the signal line contains titanium and aluminum.

12. The display device of claim 1, further comprising a via layer located between the first wiring protection layer and the signal line, wherein the via layer completely covers the first wiring protection layer.

13. The display device of claim 1, wherein a width of the bending protection layer in a direction parallel to the substrate is greater than a width of the first wiring protection layer.

14. The display device of claim 1, further comprising a second wiring protection layer between the substrate and the first wiring protection layer, wherein the first wiring protection layer completely covers the second wiring protection layer.

15. The display device of claim 14, wherein the second wiring protection layer comprises a second surface facing the substrate, the second surface comprises a fourth portion in contact with the first substrate, a fifth portion in contact with the second substrate, and a sixth portion located between the fourth portion and the fifth portion and overlapping the bending area, and the sixth portion is exposed to an outside.

16. The display device of claim 15, wherein the second wiring protection layer comprises polyimide.

17. The display device of claim 14, wherein a gap between a side surface of the first wiring protection layer and a side surface of the second wiring protection layer is 2 μm or greater.

18. A display device comprising:

a substrate comprising a main region and a pad area;

a buffer layer on the main region of the substrate;

a first electrode on the buffer layer;

a first wiring protection layer on the substrate, the first wiring protection layer overlapping a bending area located between the main region and the pad area;

a signal line on the first electrode and the first wiring protection layer; and a bending protection layer on the signal line, the bending protection layer overlapping the bending area, wherein the first wiring protection layer is covered by the bending protection layer while overlapping the main region and the pad area in a plan view.

19. The display device of claim 18, further comprising a second wiring protection layer located between the substrate and the first wiring protection layer, wherein the second wiring protection layer is covered by the first wiring protection layer while overlapping the main region and the pad area in the plan view.

20. The display device of claim 19, wherein the first wiring protection layer, the second wiring protection layer, and the bending protection layer completely cover the signal line while overlapping the bending area in the plan view.

* * * * *